United States Patent
Tegen et al.

(10) Patent No.: US 9,412,601 B2
(45) Date of Patent: Aug. 9, 2016

(54) METHOD FOR PROCESSING A CARRIER

(71) Applicant: Infineon Technologies Dresden GmbH, Dresden (DE)

(72) Inventors: Stefan Tegen, Dresden (DE); Marko Lemke, Dresden (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 178 days.

(21) Appl. No.: 13/833,166

(22) Filed: Mar. 15, 2013

(65) Prior Publication Data
US 2014/0273445 A1   Sep. 18, 2014

(51) Int. Cl.
*H01L 21/285* (2006.01)
*H01L 21/8234* (2006.01)
*H01L 21/8238* (2006.01)
*H01L 21/308* (2006.01)
*H01L 29/66* (2006.01)
*H01L 21/84* (2006.01)

(52) U.S. Cl.
CPC ........ *H01L 21/28506* (2013.01); *H01L 21/308* (2013.01); *H01L 21/3083* (2013.01); *H01L 21/823431* (2013.01); *H01L 21/823821* (2013.01); *H01L 29/66795* (2013.01); *H01L 21/845* (2013.01)

(58) Field of Classification Search
None
See application file for complete search history.

(56) References Cited

U.S. PATENT DOCUMENTS

| | | | |
|---|---|---|---|
| 5,482,885 A | 1/1996 | Lur et al. | |
| 2002/0043690 A1 | 4/2002 | Doyle et al. | |
| 2004/0262676 A1* | 12/2004 | Lee | H01L 29/7851 257/328 |
| 2005/0001273 A1* | 1/2005 | Bryant et al. | 257/369 |
| 2005/0269629 A1* | 12/2005 | Lee et al. | 257/327 |
| 2006/0113605 A1* | 6/2006 | Currie | 257/368 |
| 2009/0206374 A1* | 8/2009 | Anderson et al. | 257/270 |
| 2011/0053361 A1* | 3/2011 | Muralidhar et al. | 438/585 |
| 2011/0101455 A1* | 5/2011 | Basker et al. | 257/347 |
| 2012/0126325 A1 | 5/2012 | Wang et al. | |
| 2013/0037886 A1* | 2/2013 | Tsai | H01L 21/823821 257/351 |
| 2013/0154011 A1* | 6/2013 | Jou et al. | 257/368 |
| 2013/0234147 A1* | 9/2013 | Wu et al. | 257/76 |
| 2014/0065802 A1* | 3/2014 | Chang | H01L 27/1211 438/479 |
| 2014/0346574 A1* | 11/2014 | Cai et al. | 257/288 |

\* cited by examiner

*Primary Examiner* — Matthew W Such
*Assistant Examiner* — Abul Kalam

(57) ABSTRACT

A method for processing a carrier may include: forming a plurality of structure elements at least one of over and in a carrier, wherein at least two adjacent structure elements of the plurality of structure elements have a first distance between each other; depositing a first layer over the plurality of structure elements having a thickness which equals the first distance between the at least two adjacent structure elements; forming at least one additional layer over the first layer, wherein the at least one additional layer covers an exposed surface of the first layer; removing a portion of the at least one additional layer to expose the first layer partially; and partially removing the first layer, wherein at least one sidewall of the at least two adjacent structure elements is partially exposed.

12 Claims, 17 Drawing Sheets

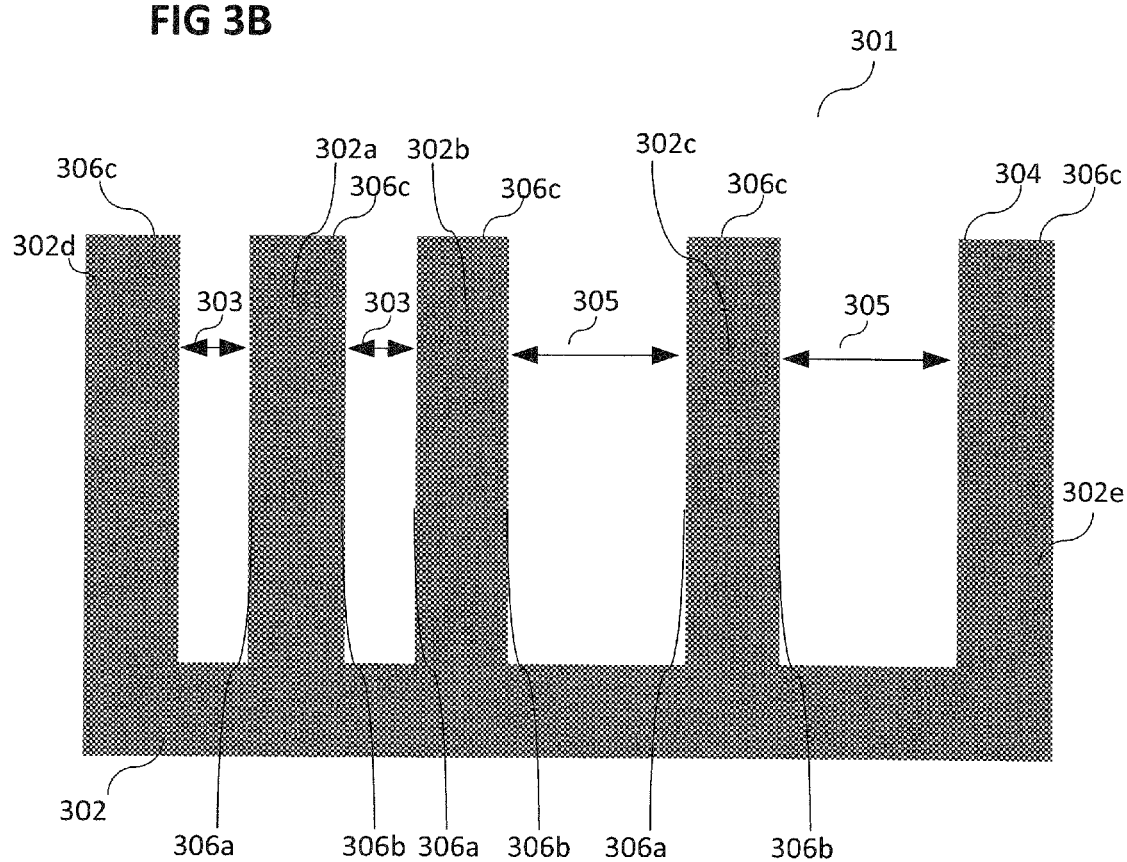

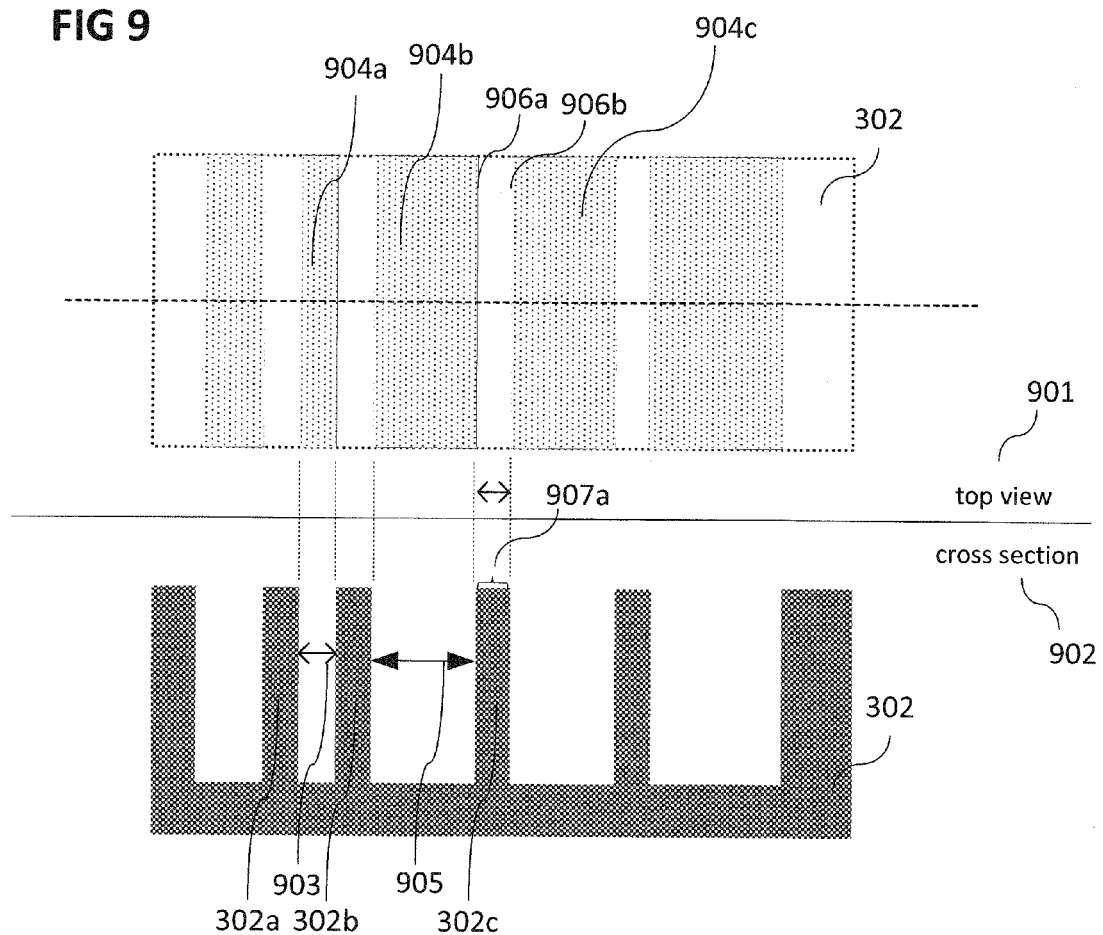

METHOD FOR PROCESSING A CARRIER

TECHNICAL FIELD

Various embodiments relate generally to a method for processing a carrier.

BACKGROUND

Fabricating an integrated circuit, a chip, or a die or processing a carrier may include at least one etch process to generate the desired shape of a structure element. Applying an etch process, such as plasma etching or reactive plasma etching for example, may in face of many advantages have the problem that loading mechanisms (loading effects), e.g. micro-loading or aspect ratio dependent etching may occur. Thereby, a hole (or a recess) included in an integrated circuit on a carrier having a larger open area may finally have a larger depth than another hole (or another recess) having a smaller open area, despite using the very same etch process for both holes (or both recesses). Therefore, the distance between adjacent structure elements on a wafer and the dimensions of a structure element may influence the etch rate during an etch process.

SUMMARY

A method for processing a carrier in accordance with one or more embodiments may include: forming a plurality of structure elements at least one of over and in a carrier, wherein at least two adjacent structure elements of the plurality of structure elements have a first distance between each other; depositing a first layer over the plurality of structure elements having a thickness which equals the first distance between the at least two adjacent structure elements; forming at least one additional layer over the first layer, wherein the at least one additional layer covers an exposed surface of the first layer; removing a portion of the at least one additional layer to expose the first layer partially; and partially removing the first layer, wherein at least one sidewall of the at least two adjacent structure elements is partially exposed.

Furthermore, a method for processing a carrier in accordance with one or more embodiments may include: forming a plurality of structure elements at least one of over and in a carrier, wherein at least two adjacent structure elements of the plurality of structure elements have a first distance between each other; depositing a first layer over the plurality of structure elements having a thickness which is smaller than half of the first distance between the at least two adjacent structure elements; forming at least one additional layer over the first layer, wherein the at least one additional layer covers an exposed surface of the first layer; removing a portion of the at least one additional layer to expose the first layer partially; and partially removing the first layer, wherein at least one sidewall of the at least two adjacent structure elements is partially exposed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3H show respectively a cross section of a carrier at various processing stages referring to method 100, according to various embodiments;

FIG. 9 shows a top view and a cross section of a carrier including a plurality of recesses, according to various embodiments.

DESCRIPTION

Figure 1:
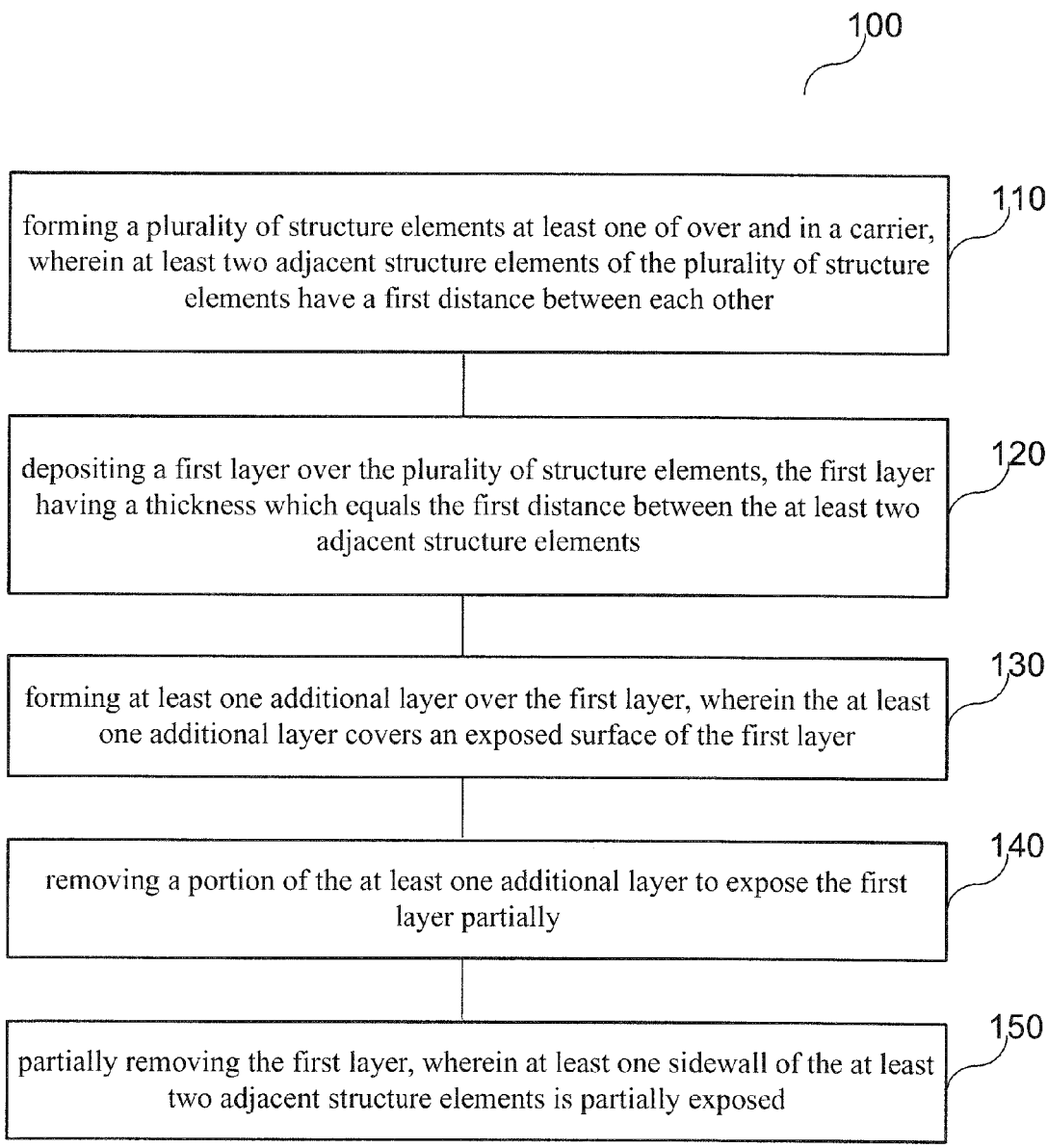
FIG. 1 shows a flow diagram of a method 100 for processing a carrier, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the lateral extension of a structure (or the lateral extension of a structure element), may be used herein to mean an extension along a direction parallel to the surface of a carrier. That means that the surface of a carrier (e.g. the surface of a substrate, or the surface of a wafer) may serve as reference. Further, the term "width" used with regards to a width of a structure (or a width of a structure element) may be used herein to mean the lateral extension of a structure (or a lateral extension of a structure element). Further, the term "height" used with regards to a height of a structure (or a height of a structure element), may be used herein to mean an extension of a structure (or a structure element) along a direction perpendicular to the surface of a carrier.

The word "cover" used with regards to deposited material covering a structure (or a structure element), may be used herein to mean that a deposited material may cover a structure (or a structure element) completely, e.g. covering all exposed sides and surfaces of a structure (or a structure element). The word "cover" used with regards to deposited material covering a structure (or a structure element), may be used herein to mean that the deposited material may cover a structure (or a structure element) at least partially, e.g. at least partially covering the exposed sides and surfaces of a structure (or a structure element).

According to various embodiments, forming a layer (e.g. depositing a layer, e.g. depositing a material, e.g. using a layering process) as described herein may also include forming a layer, wherein the layer may include various sub layers, whereby different sub layers may include different materials respectively. In other words, various different sub layers may be included in a layer, or various different regions may be included in a deposited layer or in a deposited material.

Since there may be many individual processes used in semiconductor processing (e.g. in the fabrication of an integrated circuit, a chip, or a die, e.g. in processing a carrier, a substrate, or a wafer), usually carried out in sequence, several basic manufacturing techniques may be used at least once in the overall process. The following description of basic techniques should be understood as illustrating examples, which techniques may be included in processes described in the following. The basic techniques exemplarily described herein may be not necessarily need to be construed as preferred or advantageous over other techniques or methods, since they only serve to illustrate how one or more embodiments of the invention may be practiced. For sake of brevity the illustration of basic techniques exemplarily described herein is only a short overview and should not be considered as exhaustive specification.

According to various embodiments, a specific depth of an etched recess or a specific height of a structure element in an integrated circuit may be relevant for the functionality of the structure element. Typically, a feature (for example an opening, e.g. a hole or a recess) having a larger open area may be etched faster during an etch process (e.g. during reactive plasma etching) than a feature having a smaller open area. In other words, a larger open area may generate a larger recess (or deeper recess) during an etch process than a smaller open area. Therefore, if the respective distances between several adjacent structure elements are different from each other, e.g. due to the specific design or layout of the integrated circuit, so that two open areas may also differ from each other, an etch process may cause different etch results depending on the surrounding of an individual structure element.

Use of an etch process during patterning of a structure element (e.g. plasma etching) may thus cause several problems, since the etching rate may depend on the surrounding of the structure element. As an example, the height of a control gate at a sidewall of a fin, as described in various embodiments in the following, may differ from the specific desired value due to loading effects during plasma etching of the gate material. Therefore, the electrical properties of a fin field-effect transistor (FinFET) may not be as desired and the operability of the FinFET may be affected.

According to various embodiments, the method for processing a carrier may provide a homogeneous (e.g. symmetrical) surrounding (with respect to an etch process) for each structure element of a plurality of structure elements, even though the distance between adjacent structure elements (e.g. fins) may not be the same for all of the structure elements on a carrier, such that loading effects may be avoided or substantially reduced during at least one processing stage.

According to various embodiments, one or more of the following basic techniques may be included in the method for processing a carrier.

Layering is one of the techniques in semiconductor processing. In a layering process, a layer (or a material forming a layer) may be deposited over a surface (e.g. over a carrier, over a wafer, over a substrate, over another layer, or the like) using deposition techniques which may include chemical vapor deposition (CVD, or a CVD process) and physical vapor deposition (PVD, or a PVD process), according to various embodiments. According to various embodiments, the thickness of a deposited layer may be in the range of a few nanometers up to several micrometers depending on its specific function of the layer. Further, according to various embodiments, a layer may include at least one of an electrically insulating material, an electrically semiconducting material, and an electrically conductive material, depending on the respective specific function of the layer. According to various embodiments, electrically conductive materials, as for example aluminum, aluminum-silicon alloys, aluminum-copper alloys, nichrome (an alloy of nickel, chromium, and/or iron), tungsten, titanium, molybdenum, or gold (or the like), may be deposited using CVD or PVD. According to various embodiments, semiconducting materials, as for example silicon (e.g. epitaxially grown silicon or polycrystalline silicon (also referred to as polysilicon)), germanium, a semiconductor compound material such as gallium arsenide (GaAs), indium phosphide (InP), or indium gallium arsenide (InGaAs) may be deposited using CVD. Insulating materials, as for example silicon oxide or silicon nitride (or the like) may be deposited using CVD or PVD. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, polysilicon, silicon dioxide, silicon nitride, and the like may be deposited using LPCVD, but also molybdenum, tantalum, titanium, nickel, tungsten, and the like may be deposited using LPCVD.

According to various embodiments, physical vapor deposition may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may also include thermal oxidation (also referred to as thermal oxidation process). According to various embodiments, thermal oxidation may be used to grow high quality silicon oxide layers (so-called high temperature oxide layer (HTO)) on a silicon surface, e.g. at temperatures in the range from about 800° C. to about 1200° C. The thermal oxidation may be performed at atmospheric pressure or at high pressure and as further development as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

It should be noted, that a variety of combinations of the materials and processes may be used within a layering process, according to various embodiments. Depending on specific aspects, as for example crystalline quality, surface roughness, edge covering behavior, growth speed, and yield, the most suitable process may be applied for the respective material, according to various embodiments.

According to various embodiments, some processes during processing a carrier may require a conformally deposited layer or conformally depositing a layer (e.g. forming a conformal layer over a plurality of structure elements, e.g. forming a conformal layer over a plurality of fins), which means that a layer (or a material forming a layer) may exhibit only small thickness variations along an interface with another body, e.g. a layer may exhibit only small thickness variations along edges, steps and/or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material. With other words, a conformal deposition process may exhibit a high edge coverage. According to various embodiments, growing a high temperature oxide layer (e.g. by using an RTA process) on a silicon surface may be regarded as conformal deposition process, or more precisely as conformal growth of a high temperature oxide layer.

Further, according to various embodiments, a conformal deposition of a layer or a conformal growth of a high temperature oxide layer may completely fill a recess or a trench, if the width of the recess or the trench is smaller than two times the layer thickness of the conformal layer. According to various embodiments, a recess or a trench may be partially filled with a material of a conformally deposited layer or a conformally grown high temperature oxide layer, if the layer thickness of the conformal layer is smaller than half of the width of the recess or the trench. According to various embodiments, if a recess or a trench is partially filled with a material of a conformally deposited layer or a conformally grown high temperature oxide layer, a remaining space may be generated within the recess or the trench, or a remaining space may be generated between the respective sidewalls of the at least two adjacent structure elements forming the recess or the trench. According to various embodiments, if a region between two adjacent structure elements is partially filled with a material of a conformally deposited layer or a conformally grown high temperature oxide layer, a remaining space may be generated in the region between two adjacent structure elements. In more detail, a remaining space may be free of any material deposited in a preceding process (e.g. the remaining space may be free of any material which may be deposited prior to this during forming a plurality of structure elements and depositing a material over the plurality of structure elements).

Patterning is another technique in semiconductor processing. According to various embodiments, a patterning process may include removing selected portions of a surface layer or of a material. After a surface layer is partially removed, a pattern (or a patterned layer or patterned surface layer) may remain over the underlying structure (e.g. a pattern may remain on a wafer). Since a plurality of processes may be involved, according to various embodiments, there are various possibilities to perform a patterning process, wherein aspects may be: selecting at least one portion of a surface layer (or a material) which shall be removed, e.g. using at least one lithographic process; and removing the at least one selected portion of the surface layer, e.g. using at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. According to various embodiments, a lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) by for example wet chemical treatment. According to various embodiments, the initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of a photoresist to a surface (e.g. to a surface layer, to a carrier, or to a wafer, and the like). According to various embodiments, the preparation process may include applying a liquid or gaseous adhesion promoter (e.g. bis(trimethylsilyl)amine (HMDS)).

According to various embodiments, a resist, which may be included in a lithographic process, may be applied to cover a surface (e.g. a surface layer, a carrier, or a wafer, and the like) homogeneously. According to various embodiments, applying a resist may include spin coating to generate a thin homogenous layer of the resist. Afterwards, a resist may be prebaked to drive off excess resist solvent, according to various embodiments. According to various embodiments, several types of resists (e.g. a photoresist) may be used adapted to the process of exposing the resist to achieve desired results. According to various embodiments, positive photoresists (e.g. DNQ-Novolac, PMMA, PMIPK, PBS, and the like) may be used, whereby the resist that has been exposed to light becomes soluble to a photoresist developer, and/or negative photoresists (e.g. SU-8, poly isoprene, COP, and the like) may be used, whereby the resist that has been exposed to light becomes insoluble to a photoresist developer.

According to various embodiments, a resist may be exposed (e.g. exposing the photoresist to a pattern of light), which may be included in a lithographic process, to transfer a desired pattern to a resist, e.g. using light or electrons, wherein the desired pattern may be defined by a patterned mask (e.g. a glass carrier with a patterned chromium layer). According to various embodiments, mask-less lithography may be applied, wherein a precise beam (e.g. an electron beam or a laser beam) may be projected without using a mask directly onto the surface including the resist. According to various embodiments, the exposure to light may cause a reaction in the resist that may allow that some of the resist may be removed by a special solution (a so-called developer, e.g. a photoresist developer). Since the resolution of an optical imaging process is limited by the used wavelength, the wavelength of the used light may range from the wavelength of the visible light to a smaller wavelength in the ultra violet range, according to various embodiments. According to various embodiments, the exposure may be performed using x-rays or electrons having even a shorter wavelength than ultra violet light. According to various embodiments, projection exposure systems (e.g. steppers or scanners) may be used projecting the mask many times onto a surface including a resist to create the complete exposure pattern.

According to various embodiments, a resist may be developed (e.g. developing the photoresist using a photoresist developer), which may be included in a lithographic process, to partially remove the resist, thus generating a patterned resist layer remaining on the surface (e.g. on a surface layer or on a carrier, a wafer, and the like). According to various embodiments, developing a resist may include a post exposure bake (a heat treatment, e.g. rapid thermal processing) before the actual developing process may be performed. According to various embodiments, a developing process may use a special chemical solution (a so-called developer) as for example sodium hydroxide or tetramethylammonium hydroxide (TMAH, a metal ion free developer). According to various embodiments, a remaining patterned resist may be solidified in a hard bake process (a heat treatment, e.g. rapid thermal processing), realizing a more durable protecting layer for later processes as for example ion implantation, wet chemical etching, or plasma etching (and the like).

Independently from the described lithographic processes, a resist may be removed completely at a desired processing stage (e.g. after at least one of an etch process, ion implantation process, and a deposition process have been performed) in a so-called resist strip process. According to various embodiments, a resist may be removed chemically and/or by using oxygen plasma.

It should be noted, that a lithographic process, according to various embodiments, including applying a resist, exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a previously deposited or grown layer (or a carrier, and the like), wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a previously deposited layer, a grown surface layer, a carrier (or substrate, or wafer), and the like. According to various embodiments, an etch process may be performed depending on the specific requirements for this process. According to various embodiments, an etch process may be selective or non-selective with respect to a specific material. According to various embodiments, an etch process may be isotropic or anisotropic, wherein an anisotropic etch process (e.g. an anisotropic wet etch process) may reveal a different etching rate along a respective crystallographic direction of a specific material or wherein an anisotropic etch process (e.g. an anisotropic dry etch process) may reveal a different etching rate for surfaces with a specific geometric alignment.

According to various embodiments, a dry etch process may be applied, as for example plasma etching, ion beam milling, or reactive ion etching (RIE).

Plasma etching generates charged ions, neutral atoms and/or radicals. During the plasma etch process the chemical reactions between the elements of the etched material and the reactive species generated by the plasma may generate volatile etch products (e.g. etch products being volatile at room temperature). Therefore, according to various embodiments, a plasma etch process may be isotropic and may be highly selective, partially selective, or non-selective depending on the used gaseous plasma etchants and the involved materials. According to various embodiments, silicon may be etched using plasma etchants like $CF_4$, $SF_6$, $NF_3$, or $Cl_2$ and silicon dioxide may be etched using plasma etchants like $CF_4$, $SF_6$, $NF_3$, and as an exemplary result, the plasma etch process may be selective to silicon (e.g. using $Cl_2$ as plasma etchant) and the plasma etch process may be non-selective to silicon and silicon dioxide (e.g. using $CF_4$, $SF_6$, $NF_3$ as plasma etchants). According to various embodiments, the plasma etch process may be selective to silicon dioxide. According to various embodiments, the plasma etch process may be selective to silicon.

According to various embodiments, a physical etch process may be applied (e.g. ion beam milling or sputter etching), wherein a material is bombarded with energetic ions of noble gases (e.g. argon ions), wherein atoms are removed from the bombarded material by the transferred momentum. According to various embodiments, the ions may approach a material approximately from one direction, and therefore, ion beam milling may be highly anisotropic and as there may be no chemical reaction involved ion milling tends to be non-selective.

According to various embodiments, a reactive ion etching (RIE) process may be applied. According to various embodiments, the ions may chemically react with a material, but can also remove atoms from the surface of a material by the transferred momentum (sputtering). Depending on the etchants and the involved materials, RIE may be configured to be selective or non-selective to specific materials. According to various embodiments, due to the mostly vertical delivery of reactive ions, reactive ion etching may be configured to be an anisotropic etch process. The etch conditions in an RIE system may depend on process parameters like pressure, gas flow, and radio frequency (RF) power. Further, the etch conditions during an RIE process may depend on the aspect ratio of the structure which shall be etched due to so-called loading effects (e.g. aspect ratio dependent etching (ARDE), and the distance between structure elements which shall be etched due to so-called micro-loading.

Further, according to various embodiments, to create a deep penetration, steep-sided holes and trenches in a material (e.g. in a wafer, in a substrate, in a deposited or grown layer, and the like) deep reactive-ion etching (DRIE) may be applied. Deep reactive-ion etching is an anisotropic etch process, typically with high aspect ratios. According to various embodiments, a pulsed etching (time-multiplexed etching) may be applied. Pulsed etching is an anisotropic etch process, which may be used to create structure elements with high aspect ratios.

It should be noted that the anisotropy in a dry etch process may result from the anisotropic momentum of the ions (or atoms, or molecules). Therefore, in contrast to a wet etch process, the crystal structure may have a minor influence on the resulting etch structures using a dry etch process. Additionally, in contrast to wet etch processes, also polycrystalline materials (e.g. polysilicon) featuring randomly oriented crystallites can be etched anisotropically creating structures with high aspect ratios (ratio of width to height of a structure element), e.g. 1:10 or even greater, e.g. 1:50 or even greater.

According to various embodiments, a patterned layer may also serve as a mask for other processes like etching, ion implantation or layering (a so-called hard mask). Further, according to various embodiments, a patterned photoresist may also serve as a mask (a so-called soft mask). According to various embodiments, a soft mask may be used for a lift-of process. The mask material may usually be selected with regard to specific needs as for example chemical stability, e.g. to perform a selective etch process which does not affect the mask material (e.g. etching away the mask material completely), or mechanical stability, e.g. to protect regions from being penetrated by ions, or to define the shape of generated structure elements during a layering process, and the like.

Since the desired shapes and structure elements may be generated in their exact dimensions (feature size) during a patterning process, patterning may be the most critical process regarding the reduction of the feature size. Errors during a patterning process may cause a distorted pattern or a misplaced pattern and therefore may change the electrically functioning of a device or of an integrated circuit. Errors in the depth of an etched recess or a deviance in the shape of a generated structure element from a desired design or layout, e.g. due to loading effects during an etch process, may affect the functionality of a structure element. Therefore, the patterning process may be adapted to the specific design or layout of an integrated circuit.

According to various embodiments, a heat treatment may be included at various points, e.g. in combination with a patterning process, as for example after an ion implantation process, after applying photoresist to expel solvents, or after depositing electrical contacts to alloy the electrically conductive material (e.g. a metal) with a carrier (e.g. a wafer, and the like), or to provide optimal deposition conditions for CVD processes (and the like). According to various embodiments, the heating of a carrier (a wafer, a substrate, and the like) may be performed with direct contact, e.g. a hot plate, or by radiation, e.g. using a laser or lamps. According to various embodiments, a rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

According to various embodiments, a planarization process may be applied as for example to reduce the surface roughness or the reduced variations in the depth profile of a carrier or a wafer surface including structure elements having different heights, since some processes may require a flat surface (a planar surface) (e.g. high resolution lithography). According to various embodiments, a planarization process may be necessary as the number of performed layering processes and patterning processes increases and as a planar surface may be required.

According to various embodiments, a chemical mechanical polishing process (CMP or CMP process) may be performed, wherein this process may be selective to at least one specific material on the surface of a carrier (e.g. on the main processing surface of a wafer or a substrate, e.g. on a surface layer, and the like). According to various embodiments, a chemical mechanical polishing process (CMP) may be performed, wherein this process may be non-selective to a specific material on the surface of a carrier (e.g. on the main processing surface of a wafer or a substrate, e.g. on a surface layer, and the like). According to various embodiments, a planarization process may be included additionally in several processes, e.g. in layering processes, patterning processes, and the like.

According to various embodiments, chemical mechanical polishing (a CMP process) may be used to remove at least one material from a surface layer or at least to partially remove at least one material from a surface layer (e.g. from a main processing surface of a wafer or a substrate). According to various embodiments, chemical mechanical polishing may be used to remove various materials from an exposed region on the surface of a carrier. According to various embodiments, using a chemical mechanical polishing process, a flat surface may be generated by removing at least partially at least one material from the surface of a carrier. According to various embodiments, the surface of the carrier may be a main processing surface of a wafer or a main processing surface of a substrate. According to various embodiments, the main processing surface may include at least one structure element.

According to various embodiments, the carrier (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

FIG. 1 shows a flow diagram of a method 100 for processing a carrier according to various embodiments. Method 100 may include, in 110, forming a plurality of structure elements at least one of over and in a carrier, wherein at least two adjacent structure elements of the plurality of structure elements may have a first distance between each other; further, in 120, depositing a first layer over the plurality of structure elements having a thickness which equals the first distance between the at least two adjacent structure elements; in 130, forming at least one additional layer over the first layer, wherein the at least one additional layer may cover an exposed surface of the first layer; in 140, removing a portion of the at least one additional layer to expose the first layer partially; and, in 150, partially removing the first layer, wherein at least one sidewall of the at least two adjacent structure elements may be partially exposed.

Figure 2:
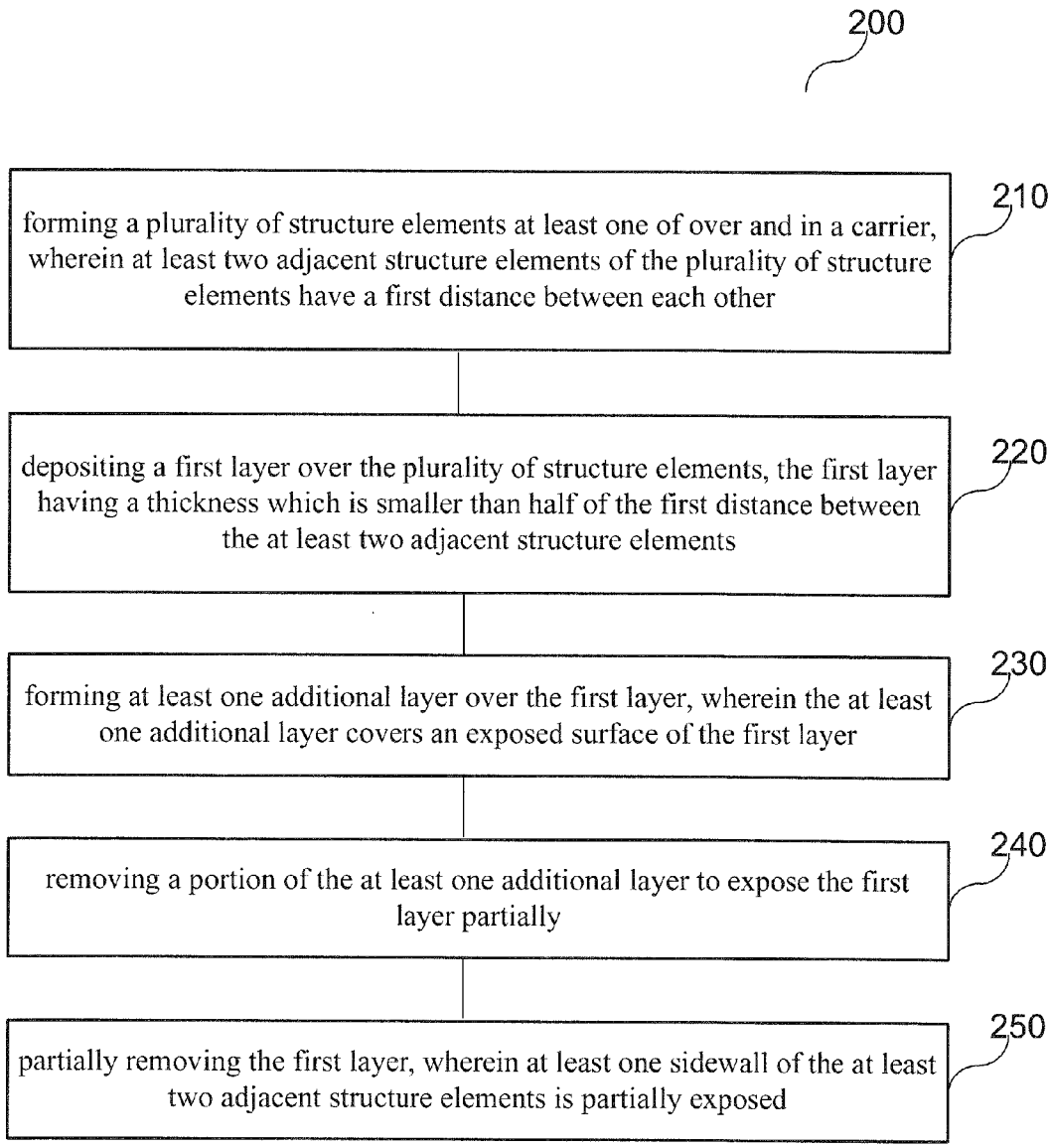
FIG. 2 shows a flow diagram of a method 200 for processing a carrier, according to various embodiments.

FIG. 2 shows a flow diagram of a method 200 for processing a carrier according to various embodiments. Method 200 may include, in 210, forming a plurality of structure elements at least one of over and in a carrier, wherein at least two adjacent structure elements of the plurality of structure elements have a first distance between each other; further, in 220, depositing a first layer over the plurality of structure elements having a thickness which is smaller than half of the first distance between the at least two adjacent structure elements; in 230, forming at least one additional layer over the first layer, wherein the at least one additional layer may cover an exposed surface of the first layer; in 240, removing a portion of the at least one additional layer to expose the first layer partially; and, in 250, partially removing the first layer, wherein at least one sidewall of the at least two adjacent structure elements may be partially exposed.

According to various embodiments, the plurality of structure elements, as described referring to method 100 and method 200 and shown in FIG. 1 and FIG. 2, may be provided on a main processing surface of the carrier (e.g. formed at least one of over and in the surface of the carrier). According to various embodiments, forming a plurality of structure elements over the surface of the carrier may be considered to be equal with forming a plurality of structure elements in the surface of the carrier with respect to applying method 100 and method 200, as described in the following.

According to various embodiments, at least two adjacent structure elements of the plurality of structure elements, as described referring to method 100 and shown in FIG. 1, may have a distance between each other which is larger than two times the first distance. That means, that in 110, a plurality of structure elements may be formed, wherein at least two adjacent structure elements of the plurality of structure elements may have a first distance between each other and at least two adjacent structure elements of the plurality of structure elements may have a distance between each other being larger than two times the first distance.

According to various embodiments, forming the at least one additional layer as described referring to method 100 and as illustrated in FIG. 1, may include forming at least a second layer over the first layer, wherein the second layer may fill a remaining space between adjacent structure elements of the plurality of structure elements. According to various embodiments, if at least two adjacent structure elements of the plurality of structure elements have a first distance between each other and at least two adjacent structure elements of the plurality of structure elements have a distance between each other being larger than two times the first distance, filling a remaining space between adjacent structure elements of the plurality of structure elements may include filling at least one remaining space having a first width, or filling a plurality of remaining spaces which may include remaining spaces having different widths.

According to various embodiments, at least two adjacent structure elements of the plurality of structure elements, as described referring to method 200 and shown in FIG. 2, may have a distance between each other which is larger than the first distance. That means, that in 210, a plurality of structure elements may be formed, wherein at least two adjacent structure elements of the plurality of structure elements may have a first distance between each other and at least two adjacent structure elements of the plurality of structure elements may have a distance between each other being larger than the first distance.

According to various embodiments, forming the at least one additional layer as described referring to method 200 and as illustrated in FIG. 2, may include forming a second layer over the first layer and afterwards forming a third layer over the second layer, wherein at least one of the second layer and the third layer may fill a remaining space between the at least two adjacent structure elements. According to various embodiments, if at least two adjacent structure elements of the plurality of structure elements have a first distance between each other and at least two adjacent structure elements of the plurality of structure elements have a distance between each other being larger than the first distance, filling a remaining space between adjacent structure elements of the plurality of structure elements may include filling at least one remaining space having a first width and filling at least one remaining space having a width which is larger than the first width.

According to various embodiments, forming a plurality of structure elements at least one of over and in a carrier, as described in 110 referring to method 100 and in 210 referring to method 200, may include forming a plurality of structure elements, wherein each structure element of the plurality of structure elements may have at least one sidewall and at least one upper surface. According to various embodiments, the upper surfaces of the plurality of structure elements may run parallel to each other, or may have a small deviance from being parallel to each other, and may be aligned parallel to the surface of the carrier, or may have a small deviance from being parallel to the surface of the carrier. According to various embodiments, the sidewalls of the plurality of structure elements may run parallel to each other, or may have a small deviance from being parallel to each other, and may be aligned perpendicular to the surface of the carrier, or may have a small deviance from being perpendicular to the surface of the carrier.

According to various embodiments, a plurality of structure elements may be formed in a carrier, e.g. by removing part of the material forming the carrier (e.g. by patterning the carrier using at least one patterning process). Further, according to various embodiments, forming a plurality of structure elements in a carrier may include a layering process, e.g. a layering process which may be carried out after the patterning of the carrier to provide the plurality of structure elements in the carrier. According to various embodiments, the at least one upper surface of each of the plurality of structure elements may form a common surface with the surface of the carrier.

According to various embodiments, a plurality of structure elements may be formed over a carrier, e.g. by using at least one layering process and at least one patterning process to provide the plurality of structure elements over the carrier. According to various embodiments, the upper surfaces of the plurality of structure elements may form a common surface.

According to various embodiments, the base area of at least one structure element of the plurality of structure elements may have a rectangular shape, or may have a small deviance from a rectangular shape (the base area may be seen in a top view or in a cross section parallel to the surface of the carrier). According to various embodiments, the cross section of at least one structure element of the plurality of structure elements may have a rectangular shape, or may have a small deviance from a rectangular shape. A small deviance, as mentioned before, may be for example a deviance in the angular range from zero to five degrees (e.g. 1° to 5°, e.g. 0.1° to 2°, or in a similar range).

According to various embodiments, referring to the shape of the base area and the shape of the cross section of a structure element, a structure element may be, with the exception of some minor differences, for example a cuboid. According to various embodiments, at least one structure element may be a fin. According to various embodiments, all structure elements of the plurality of structure elements may have the same shape, e.g. the shape of a fin. According to various embodiments, the plurality of structure elements may include structure elements which may have various shapes. According to various embodiments, at least one structure element of the plurality of structure elements may have a different shape than another structure element of the plurality of structure elements. According to various embodiments, at least one structure element of the plurality of structure elements may have a different external dimension (or size) than another structure element of the plurality of structure elements.

Figure 3A:
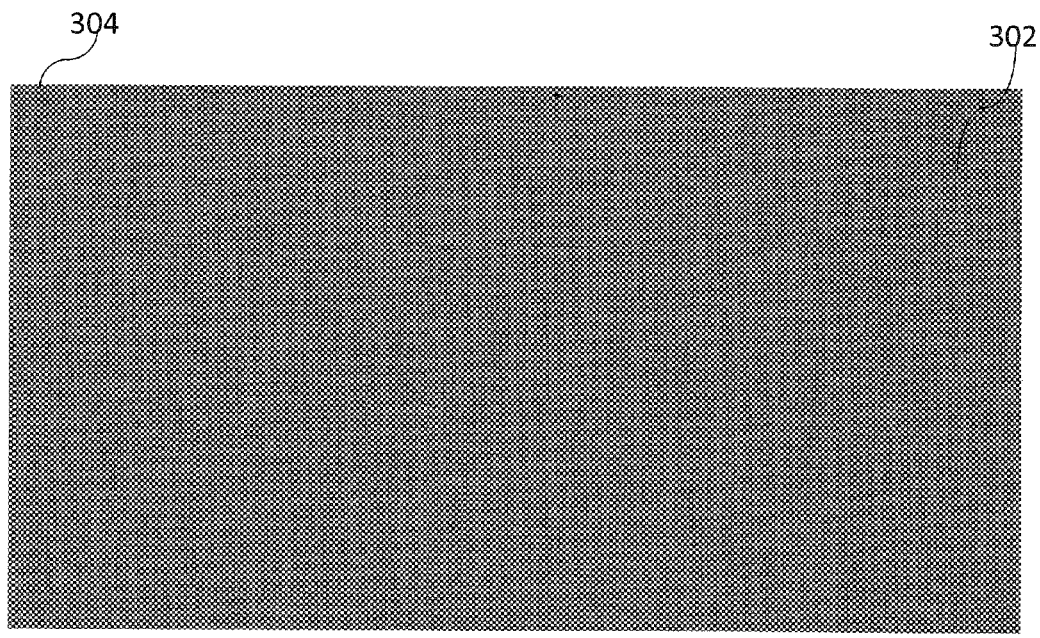

FIG. 3A schematically shows a cross section of a carrier 302 at an initial processing stage, in accordance with various embodiments. According to various embodiments, the carrier 302 may be a silicon wafer, a silicon substrate, or a carrier including another semiconductor material, as described before. According to various embodiments, the carrier 302 may have a main processing surface 304, which may be the upper surface of the carrier 302 according to some embodiments.

As described above in 110 with reference to method 100 illustrated in FIG. 1, a plurality of structure elements may be formed at least one of over and in the carrier 302, wherein at least two adjacent structure elements may have a first distance between each other and at least two adjacent structure elements may have a distance between each other being larger than two times the first distance, according to various embodiments.

FIG. 3B schematically shows a cross section of the carrier 302 including a plurality of structure elements (also referred to as structure 301) at a first processing stage. As shown in FIG. 3B, the structure 301 may be formed in the carrier 302. According to various embodiments, the structure 301 may include a plurality of structure elements 302a-302e (five structure elements 302a, 302b, 302c, 302d, and 302e are shown as an example, however the number of structure elements may be smaller than five or larger than five, and may be any number greater than one in general), wherein at least two adjacent structure elements (e.g. structure elements 302a and 302b as well as structure elements 302d and 302a in the embodiment shown) may have a first distance 303 between each other and at least two adjacent structure elements (e.g. structure elements 302b and 302c as well as structure elements 302c and 302e in the embodiment shown) may have a distance 305 between each other being larger than two times the first distance 303.

According to various embodiments, each of the plurality of structure elements 302a-302e may have a first sidewall 306a, a second sidewall 306b, and an upper surface 306c, as shown exemplarily for structure elements 302a and 302b. According to various embodiments, the distance between two adjacent structure elements may be the distance between respective first and second sidewalls 306a, 306b of the two adjacent structure elements facing each other, e.g. the first distance 303 between the two adjacent structure elements 302a and 302b may be the distance between the second sidewall 306b of structure element 302a and the first sidewall 306a of structure element 302b. According to various embodiments, the distance 305 (e.g. the distance between the second sidewall 306b of structure element 302b and the first sidewall 306a of structure element 302c) between the two adjacent structure elements 302b and 302c may be larger than two times the first distance 303 between adjacent structure elements 302a and 302b. Further, according to various embodiments, the surface 304 of the carrier 302 may form a common surface with the respective upper surface 306c of each structure element of the plurality of structure elements 302a-302e formed in the carrier 302.

According to various embodiments, the upper surfaces 306c of the structure elements 302a, 302b, 302c, 302d, 302e as shown in FIG. 3B may run parallel to each other, or may have a small deviance from being parallel to each other, and may be aligned parallel to the surface 304 of the carrier 302, or may have a small deviance from being parallel to the surface 304 of the carrier 302. According to various embodiments, the first and second sidewalls 306a, 306b of a structure element, as shown in FIG. 3B, may run parallel to each other, or may have a small deviance from being parallel to each other, and may be aligned perpendicular to the surface 304 of the carrier 302, or may have a small deviance from being perpendicular to the surface 304 of the carrier 302.

According to various embodiments, the cross sectional shape of the structure elements 302a, 302b, 302c, 302d, 302e may be a rectangular shape, or may have a small deviance from being rectangular. A small deviance, as already mentioned before, may be for example a deviance in the angular range from zero to five degrees (e.g. 1° to 5°, e.g. 0.1° to 2°, or in a similar range). According to various embodiments, the structure elements 302a, 302b, 302c, 302d, 302e may be fins. According to various embodiments, all structure elements of the plurality of structure elements 302a-302e may have the same shape, e.g. the shape of a fin.

According to various embodiments, the structure elements 302a-302e may be formed using one or more of the above described techniques in semiconductor processing, as for example layering and patterning. According to various embodiments, structure 301 may be formed in the carrier 302 by removing material from the carrier 302 (e.g. by using at least one lithographic process and subsequently an etch process), such that the plurality of structure elements 302a-302e are formed in the carrier 302, as shown in FIG. 3B. According to various embodiments, forming the plurality of structure elements 302a-302e (or structure 301) may include at least one patterning process. According to various embodiments, forming the plurality of structure elements 302a-302e (or structure 301) may include at least one patterning process and at least one layering process (e.g. patterning a silicon wafer and subsequently growing a high temperature oxide layer over the patterned silicon wafer).

According to various embodiments, the structure elements 302a-302e may include at least one of the following materials: silicon, silicon oxide, silicon nitride, silicon oxynitride, other semiconductor materials (e.g. germanium, gallium arsenide, and/or indium phosphide), or other substrate materials, e.g. metal oxides and/or metal nitrides. According to various embodiments, the processes as described herein may not be limited to structure elements formed of a specific carrier material, as described in the following.

According to various embodiments, a plurality of structure elements may be formed over a carrier, wherein at least one layering process and at least one patterning process may be used to form the plurality of structure elements. According to various embodiments, the structure elements may be formed of any suitable or desired material using the at least one layering process (e.g. depositing a silicon layer) and the at least one patterning process (e.g. patterning the previously deposited silicon layer) to form the plurality of structure elements. According to various embodiments, forming a plurality of structure elements over a carrier may result in a similar structure as structure 301 shown in FIG. 3B, and therefore the processes as described herein referring to structure 301 may also be applied to a similar structure, wherein the plurality of structure elements are formed over the carrier.

As described above in 120 with reference to method 100 illustrated in FIG. 1, a first layer may be deposited over the plurality of structure elements, wherein the first layer may have a thickness which equals the first distance between the at least two adjacent structure elements.

Figure 3C:
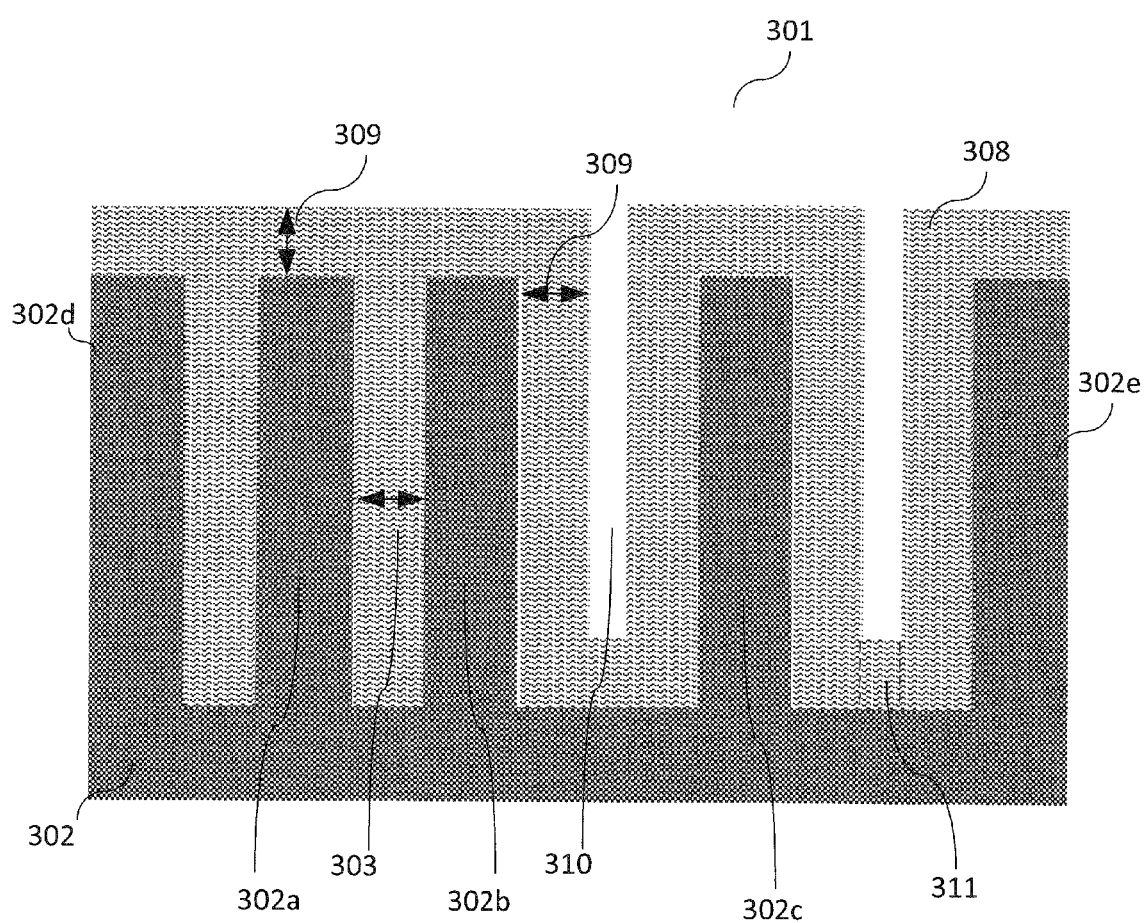

FIG. 3C schematically shows a cross section of the carrier 302, at a second processing stage, wherein a first layer 308 may be deposited over the plurality of structure elements 302a-302e, wherein the first layer 308 may have a thickness 309 which equals the first distance 303 between the two adjacent structure elements 302a and 302b and between the two adjacent structure elements 302d and 302a, as shown. According to various embodiments, the first distance 303 and therefore also the thickness of the first layer 309 may be the smallest distance between any two adjacent structure elements included in the plurality of structure elements (e.g. included in structure 301). According to various embodiments, any two adjacent structure elements in the plurality of structure elements may either have the first distance 303 or any distance larger than two times the first distance 303, e.g. distance 305.

As shown in FIG. 3C, the first layer 308 may cover the structure 301, which means that also the bottom surfaces of regions between those adjacent structure elements having a distance larger than two times the first distance 303 (e.g. the bottom surface of region 311 between adjacent structure elements 302c and 302e) may be covered with material of the first layer 308.

According to various embodiments, the first layer 308 may not cover the bottom surfaces of regions between those adjacent structure elements having a distance larger than two times the first distance 303, e.g. the bottom surface of region 311 between the structure elements 302c and 302e, or the first layer 308 may be partially removed from the bottom surfaces in those regions, e.g. in region 311 between the structure elements 302c, 302e, after the first layer 308 is deposited over the structure 301 (e.g. by using a patterning process). According to various embodiments, the first layer 308 may cover the second sidewall 306b of structure element 302b and the first sidewall 306a of structure element 302e, wherein these regions are not connected electrically via material of the first layer 308.

According to various embodiments, the first layer 308 may be deposited using a conformal deposition process, e.g. CVD, LPCVD, atomic layer deposition (e.g. ALCVD), as described above, such that the thickness 309 of the first layer 308 at the sidewalls 306a, 306b of the structure elements 302a-302e may be the same as on the upper surface 306c of the structure elements 302a-302e. According to various embodiments, the first layer 308 may include an electrically conductive material, as for example at least one of a metal, an alloy, and electrically conductive semiconductor material (e.g. aluminium, aluminium-silicon alloys, aluminium-copper alloys, nichrome (an alloy of nickel, chromium, and/or iron), tungsten, titanium, molybdenum, or gold (or the like)). According to various embodiments, the first layer 308 may include silicon (e.g. polycrystalline silicon), for example electrically conductive silicon (e.g. doped silicon, e.g. doped polycrystalline silicon). According to various embodiments, the material of the first layer 308 may be selected from a group of materials that may be etched selectively with respect to a material of the structure elements 302a-302e included in structure 301. According to various embodiments, the material of the first layer 308 may be selected from a group of materials that may be etched selectively with respect to a surface material of the plurality of structure elements 302a-302e included in structure 301.

According to various embodiments, conformally depositing the first layer 308 having a thickness which equals the first distance 303 between the two adjacent structure elements 302a and 302b (and also between the two adjacent structure elements 302d and 302a according to the embodiment shown), as shown in FIG. 3C, may result in the formation of a remaining space 310 between adjacent structure elements having a distance between each other which is larger than two times the first distance 303 (e.g. between structure elements 302b and 302c having the distance 305, and also between structure elements 302c and 302e according to the embodiment shown). According to various embodiments, the lateral extension of the remaining space 310 may be large enough to be filled using an additional layering process subsequently. According to various embodiments, the layer thickness of the first layer 308 may be in the range from about 10 nm to about 200 nm, e.g. from about 30 nm to about 150 nm, e.g. from about 60 nm to about 120 nm, e.g. a layer thickness of about 90 nm according to one embodiment (or larger than 200 nm, according to another embodiment). According to various embodiments, the lateral extension of the remaining space 310 (e.g. distance 305 minus two times first distance 303) may be larger than 20 nm, e.g. in the range of about 20 nm to about 1000 nm.

As described above in 130 with reference to method 100 illustrated in FIG. 1, at least one additional layer may be formed over the first layer, wherein the at least one additional layer may cover an exposed surface of the first layer, as will be described in the following in further detail with reference to FIG. 3D.

Figure 3D:
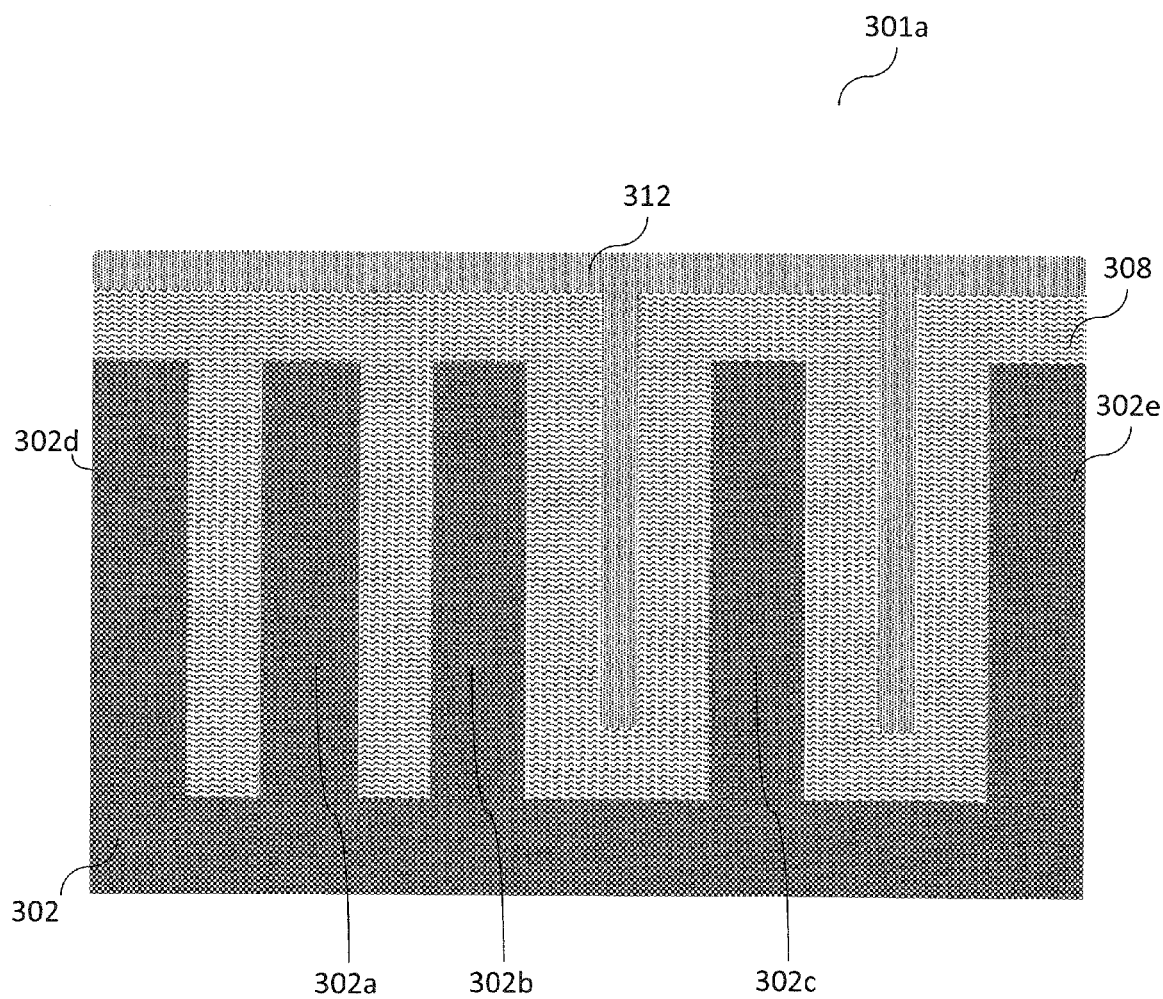

FIG. 3D schematically shows a cross section of the carrier 302, at a third processing stage, wherein an additional layer 312 is formed over the first layer 308. Thus, a structure 301a may be obtained. According to various embodiments, the additional layer 312 may cover the first layer 308, as shown in FIG. 3D. According to various embodiments, the additional layer 312 may include an insulating material. According to various embodiments, the additional layer 312 may include an oxide, e.g. silicon oxide. According to various embodiments, the additional layer 312 may include a nitride, e.g. silicon nitride or titanium nitride. According to various embodiments, the additional layer 312 may include carbon. According to various embodiments, the material of the additional layer 312 may be selected from a group of suitable materials, such that the material of the first layer 308 may be etched selectively with respect to the additional layer 312. According to various embodiments, the additional layer 312 may include the same material as the plurality of structure elements 302a-302e included in structure 301. According to various embodiments, the additional layer 312 may include the same material as a surface layer of the structure elements 302a-302e.

According to various embodiments, the additional layer 312 may be formed by a layering process, as described above. According to various embodiments, the additional layer 312 may be deposited using CVD or PVD, as described above. According to various embodiments, the additional layer 312 may be grown using thermal oxidation (e.g. RTO) or thermal nitridation (e.g. rapid thermal nitridation) of the first layer 308, wherein a high temperature oxide (high temperature silicon oxide) or a high temperature nitride (high temperature silicon nitride) may be formed over the first layer 308.

According to various embodiments, the additional layer 312 may fill the remaining space 310 between the two adjacent structure elements 302b and 302c, and also between the two adjacent structure elements 302c and 302e according to this embodiment. According to various embodiments, the additional layer 312 may fill a remaining space between two adjacent structure elements (e.g. structure elements 302b and 302c) having a distance between each other which is larger than two times the first distance 303 (e.g. distance 305 between the two adjacent structure elements 302b and 302c, wherein the distance 305 is larger than two times the first distance 303 between the two adjacent structure elements 302a and 302b).

According to various embodiments, more than one additional layer may be formed over the first layer 308 by using more than one layering process. According to various embodiments, at least one layer of the additional layers may be formed by thermal oxidation or thermal nitridation of the first layer 308, as described above. According to various embodiments, at least one layer of the additional layers may be formed using a deposition process, as for example a CVD process or PVD process (e.g. depositing silicon oxide using a CVD process).

According to various embodiments, at least one layer of the additional layers may be formed by a conformal deposition process (e.g. LPCVD, atomic layer deposition, ALCVD) or a conformal growth process (e.g. a conformal growth of a high temperature oxide layer or e.g. a conformal growth of a high temperature nitride layer). If, for example, the remaining space between two adjacent structure elements has a small width (e.g. a width in a range from about 10 nm to about 100 nm, e.g. between about 20 nm and about 75 nm, e.g. in the range from about 20 nm to about 1000 nm), at least one conformal additional layer may fill the remaining space having the small width.

As described above in 140 with reference to method 100 illustrated in FIG. 1, a portion of the at least one additional layer may be removed to expose the first layer partially, as will be described in the following in further detail with reference to FIG. 3E.

Figure 3E:
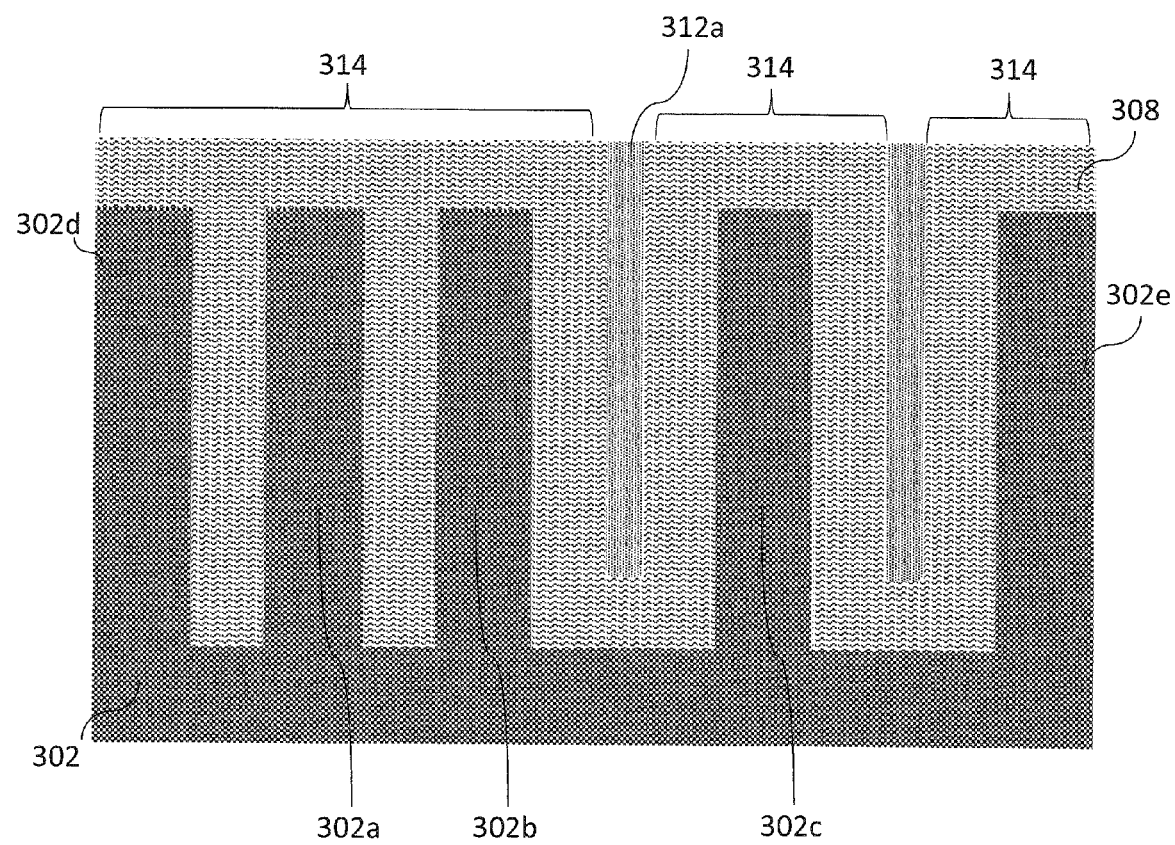

FIG. 3E schematically shows a cross section of the carrier 302 at a fourth processing stage, wherein the additional layer 312 may be partially removed. According to various embodiments, a part of the additional layer 312 may remain after removing the additional layer 312 partially (referred to as remaining part 312a of the additional layer 312). As shown in FIG. 3E, according to various embodiments, the additional layer 312 may be partially removed by etching the surface of the structure 301a shown in FIG. 3D. According to various embodiments, the additional layer 312 may be partially removed by using at least one etch process (e.g. reactive ion etching, e.g. chemical mechanical polishing). According to various embodiments, the at least one etch process may be selective to the additional layer 312, such that the first layer 308 may not be etched in the same etch process, as shown in FIG. 3E. According to various embodiments, removing a portion of the additional layer 312 may partially expose the first layer 308. According to various embodiments, one or more regions 314 of the first layer 308 may be exposed, as shown in FIG. 3E.

As described above in 150 with reference to method 100 illustrated in FIG. 1, the first layer may be partially removed, wherein at least one sidewall of the at least two adjacent structure elements is partially exposed, as will be described in the following in further detail with reference to FIG. 3F.

Figure 3F:
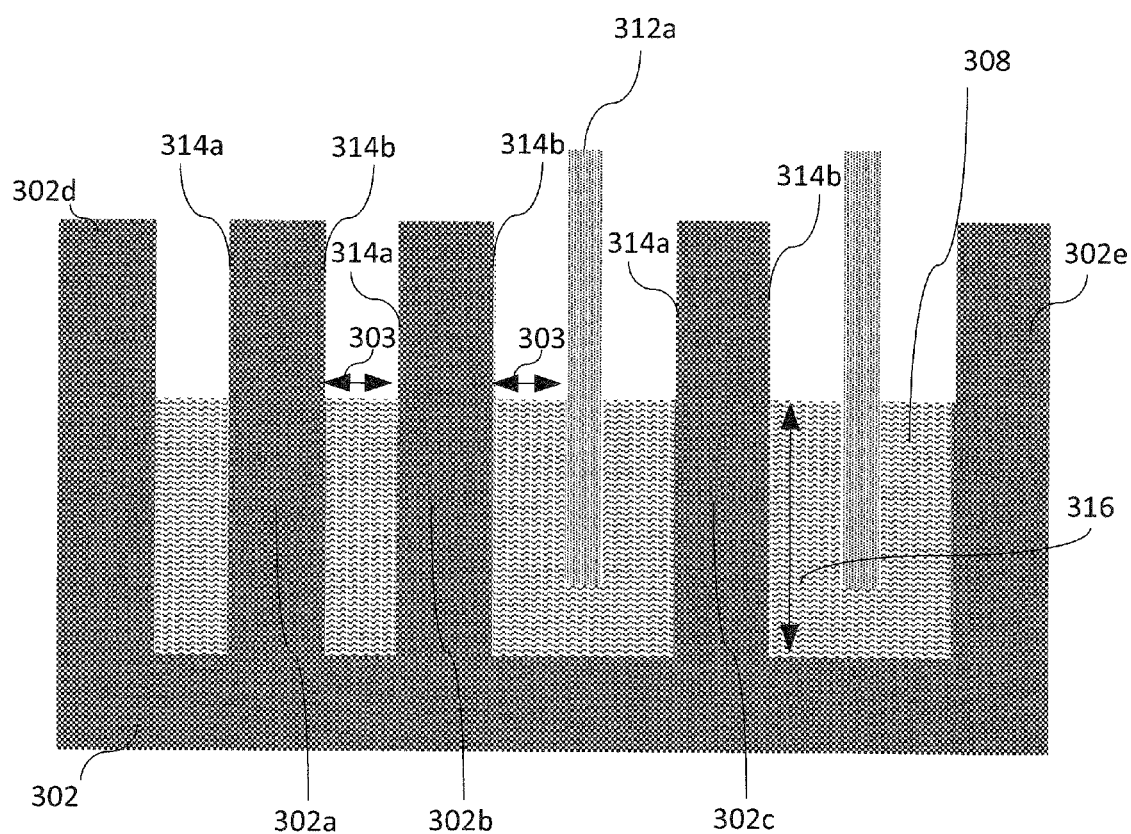

FIG. 3F schematically shows a cross section of the carrier 302, at a fifth processing stage, wherein the first layer 308 is partially removed, wherein the sidewalls 306a, 306b of the plurality of structure elements 302a-302e are partially exposed. According to various embodiments, the first layer 308 may be partially removed using an etch process, as for example a plasma etch process. According to various embodiments, the first layer 308 may be partially removed using reactive ion etching. According to various embodiments, the etch process removing the first layer 308 partially may be selective to the material of the first layer 308 and the material of the additional layer 312, which means that the structure elements 302a-302e and the remaining part 312a of the additional layer 312 may not be etched in this process. Therefore, according to various embodiments, the height 316 of remaining material of the first layer 308 at the sidewalls 306a, 306b of the structure elements 302a-302e may be the same (or substantially the same) for each structure element of the plurality of structure elements 302a-302e, although the distance 305 between the two adjacent structure elements 302b and 302c and between the two adjacent structure elements 302c and 302e may be larger than two times the first distance 303 between structure elements 302a and 302b. Regarding to this, it has to be noted, that the dependence of the etch rate on the aspect ratio may be reduced or prevented by the remaining material of the additional layer 312 (e.g. remaining part 312a of the additional layer 312) between the structure elements having a distance larger than two times the first distance 303, since the actual open area for etching the first layer 308 may be defined by the layer thickness 309 of the first layer 308, which equals the first distance 303, as shown in FIG. 3F.

According to various embodiments, when etching the first layer 308 covering the sidewalls 306a, 306b of the structure elements 302a-302e partially the height 316 of the remaining part of the first layer 308, in other words the etch result, may not depend on the distance between adjacent structure elements. That means, the exposed area of the sidewalls 306a, 306b of a structure element (e.g. exposed area 314a and 314b, as shown in FIG. 3F) may be the same for each structure element of the plurality of structure elements 302a-302e.

In the following, various modifications, extensions, and details referring to the described method 100, as shown in FIG. 1 and exemplified in FIG. 3A to FIG. 3F and the accompanying description, are described.

Referring to method 100, in various embodiments, a portion of the at least one additional layer may be removed to expose the first layer partially, in 140. Afterwards, the first layer may be partially removed, in 150, wherein at least one sidewall of the at least two adjacent structure elements is partially exposed. According to various embodiments, the method 100 may also be performed (in 140) in the following modification as exemplarily shown in FIG. 3G.

Figure 3G:
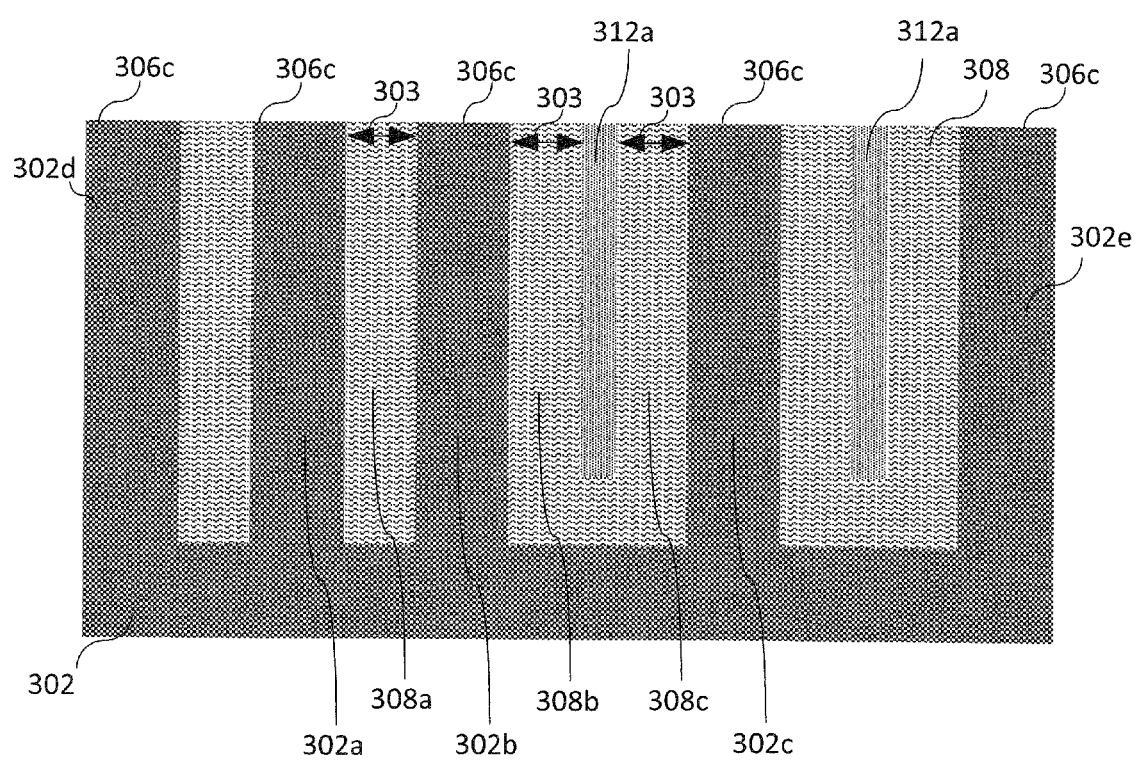

FIG. 3G shows that a portion of the additional layer 312 may be removed, such that the upper surface of the plurality of structure elements 302a-302e is exposed. Regarding to this, a portion of the first layer 308 may also be removed in 140. Due to removing a portion of the additional layer 312 and a portion of the first layer 308 (e.g. by using a CMP process, or another suitable surface etching process) a flat surface may be formed exposing the upper surface 306c of at least one structure element (the upper surface 306c of structure element 302a).

As a result, according to various embodiments, a remaining portion of the first layer 308 between two adjacent structure elements having the first distance 303 between each other (e.g. the remaining portion 308a of the first layer 308 between the two adjacent structure elements 302a and 302b, as shown in FIG. 3G) and a remaining portion of the first layer 308 between a structure element and the remaining part 312a of the additional layer 312 (e.g. the remaining portion 308b (or 308c) of the first layer 308 between structure element 302b (or 302c) and the remaining part 312a of the additional layer 312a between the two adjacent structure elements 302b and 302c) may have the same width (e.g. the width equal to the first distance 303) independently from the distance between the adjacent structure elements (e.g. distance 303 or distance 305 as shown in FIG. 3B). According to various embodiments, the material of the first layer 308 (e.g. the remaining portions 308a, 308b, and 308c of first layer 308) covering the sidewalls 306a, 306b of the structure elements 302a-302e (as shown in FIG. 3G), may have an open area of the same size, such that each structure element of the plurality of structure elements 302a-302e may have a similar surrounding despite the different distances 303, 305 between adjacent structure elements.

Referring to method 100, after removing a portion of the at least one additional layer in 140 as shown in FIG. 3G and described in the accompanying description, the first layer may be partially removed, in 150, wherein at least one sidewall of the at least two adjacent structure elements is partially exposed.

Figure 3H:
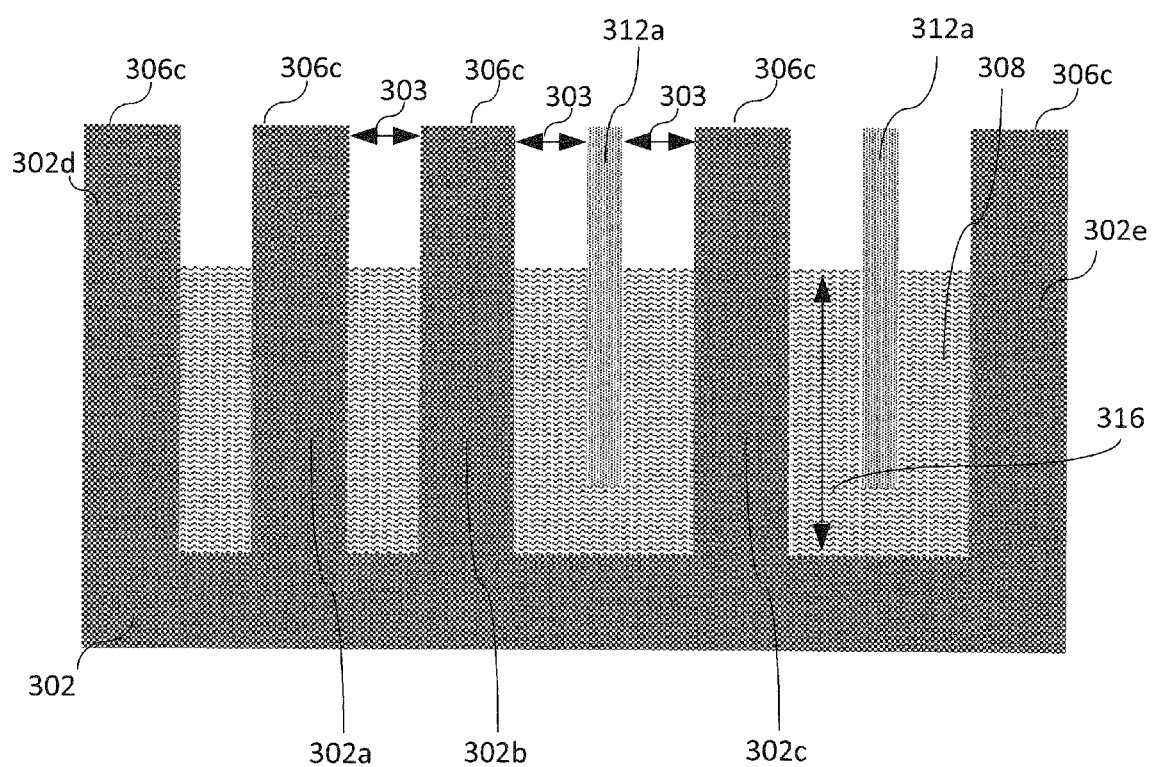

As illustrated in FIG. 3H, a selective etch process may be performed (e.g. reactive ion etching), removing a part of the material of the first layer 308) which has remained between adjacent structure elements of the plurality of structure elements 302a-302e after partial removal of the additional layer 312, as described above in connection with FIG. 3G. According to various embodiments, due to the remaining part 312a of the additional layer 312 between the adjacent structure elements 302b and 302c, the open area for etching the first layer 308 may be the same for all structure elements of the plurality of structure elements 302a-302e (e.g. the open area may be defined by the first distance 303), as shown in FIG. 3H.

FIG. 2 shows a flow diagram of a method 200 for processing a carrier according to various embodiments, wherein the method 200 for processing a carrier may be to some degree similar to the method 100. In particular, 210 in method 200 may be carried out in the same way and may include the same materials and processes as 110 in method 100; 230 in method 200 may be performed in the same way and may include the same materials and processes as 130 in method 100; 240 in method 200 may be performed in the same way and may include the same materials and processes as 140 in method 100; and 250 in method 200 may be performed in the same way and may include the same materials and processes as 150 in method 100, while 220 in method 200 may differ from 120 in method 100 and may include depositing a first layer over the plurality of structure elements having a thickness which is smaller than half of the first distance between the at least two adjacent structure elements, as shown. Further, according to various embodiments, a plurality of structure elements (e.g. structure elements 402a, 402b, 402c, 402d, and 402e shown in FIG. 4A) may be formed at least one of over and in a carrier 302, in 210, wherein at least two adjacent structure elements (e.g. the two adjacent structure elements 402a and 402b) of the plurality of structure elements may have a first distance between each other (e.g. first distance 403 shown in FIG. 4A) and at least two adjacent structure elements (e.g. the two adjacent structure elements 402b and 402c shown in FIG. 4A) of the plurality of structure elements may have a distance between each other being larger than the first distance (e.g. distance 405 shown in FIG. 4A).

Figure 4A:
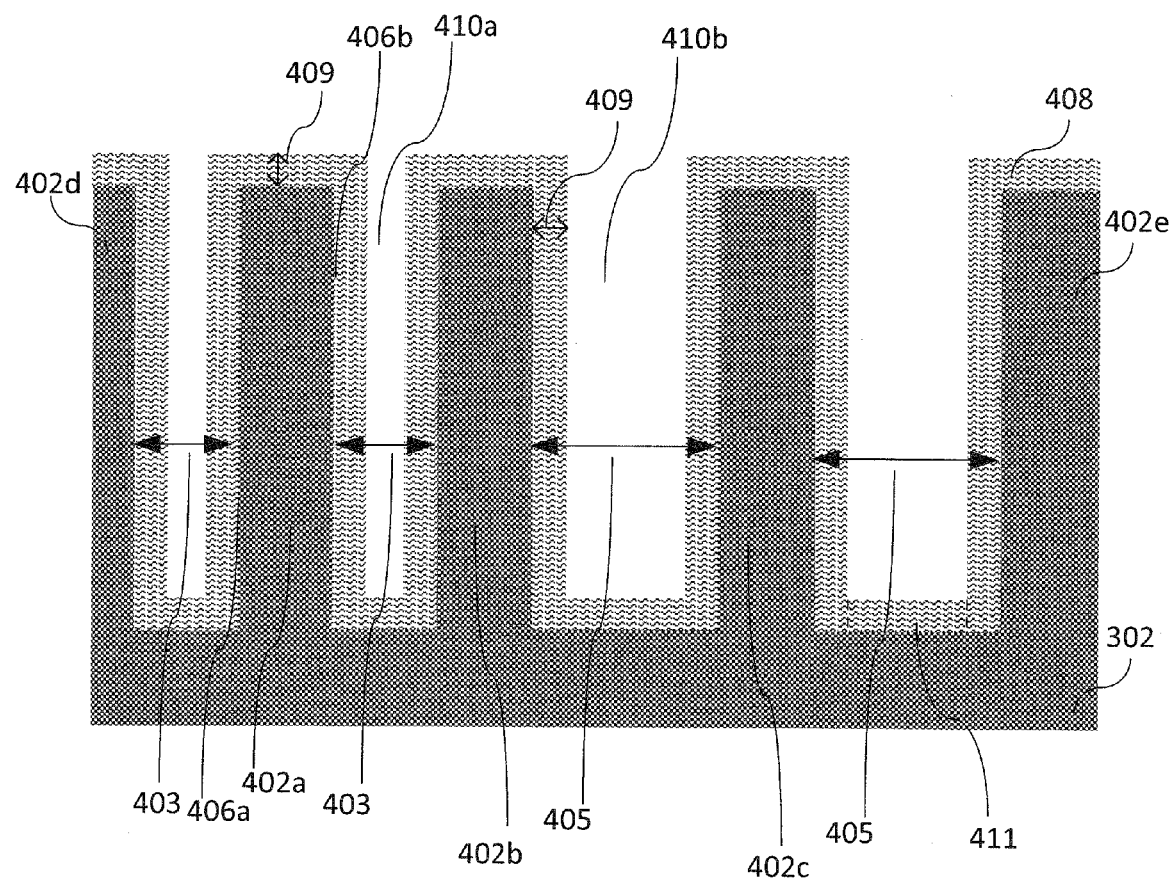
FIGS. 4A and 4B show respectively a cross section of a carrier at various processing stages referring to method 200, according to various embodiments.

FIG. 4A schematically shows a cross section of the carrier 302, at a second processing stage, wherein a first layer 408 may be deposited over a plurality of structure elements 402a-402e (five structure elements 402a, 402b, 402c, 402d, and 402e are shown as an example, however the number of structure elements may be smaller than five or larger than five, and may be any number greater than one in general), wherein the first layer 408 may have a thickness 409 which is smaller than half of the first distance 403 between the two structure elements 402a and 402b. According to various embodiments, the first distance 403 may be the smallest distance between any two adjacent structure elements included in the plurality of structure elements 402a-402e. In other words, any two adjacent structure elements in the plurality of structure elements may have a distance that is greater than or equal to the first distance 403.

As shown in FIG. 4A, the first layer 408 may cover the plurality of structure elements 402a-402e, which means that also regions between the structure elements 402a-402e may be covered (e.g. region 411) with material of the first layer 408. According to various embodiments, in analogy to 120 in method 100, the first layer 408 may be formed in a conformal deposition process, as described before. According to various embodiments, in analogy to first layer 308 as described referring to method 100, the first layer 408 as shown in FIG. 4A may include an electrically conductive material, as for example at least one of a metal, an alloy, and electrically conductive semiconductor material (e.g. aluminium, aluminium-silicon alloys, aluminium-copper alloys, nichrome (an alloy of nickel, chromium, and/or iron), tungsten, titanium, molybdenum, or gold (or the like)). According to various embodiments, the first layer 408 may include silicon (e.g. polycrystalline silicon), for example electrically conductive silicon (e.g. doped silicon, e.g. polycrystalline silicon). According to various embodiments, the material of the first layer 408 may be selected from a group of materials that may be etched selectively with respect to the material used for forming the structure elements 402a-402e. According to various embodiments, the material of the first layer 408 may be selected from a group of materials that may be etched selectively with respect to a surface material of the plurality of structure elements 402a-402e.

According to various embodiments, conformally depositing the first layer 408 with a thickness which is smaller than half of the first distance 403, as shown in FIG. 4A, may result in the formation of a remaining space 410a between two adjacent structure elements 402a and 402b having the first distance 403 between each other and the formation of a remaining space 410b between two adjacent structure elements 402b and 402c having a distance 405 between each other, wherein the distance 405 may be larger than the first distance 403.

According to various embodiments, the first distance 403 may be in the range from about 10 nm to about 300 nm, e.g. about 20 nm to about 200 nm, e.g. about 70 nm to about 110 nm, e.g. about 80 nm to about 100 nm, e.g. about 90 nm, or e.g. smaller than 90 nm or e.g. larger than 90 nm.

According to various embodiments, the layer thickness of the first layer 408 may be in the range from about 20 nm to 500 nm, e.g. 50 nm to 200 nm, e.g. 20 nm to 40 nm, or in the range of about 30 nm, or e.g. larger than 30 nm, or e.g. smaller than 30 nm.

According to various embodiments, the lateral extension of the remaining space (e.g. remaining space 410a and remaining space 410b) between the respective two adjacent structure elements may be large enough to be filled using at least one additional layering process in a layering process performed later. According to various embodiments, the lateral extension of a remaining space (e.g. remaining space 410a (first distance 403 minus two times the thickness 409 of the first layer 408) and remaining space 410b (distance 405 minus two times the thickness 409 of the first layer 408)) may be larger than 20 nm, e.g. in the range of about 20 nm to about 1000 nm.

Figure 4B:
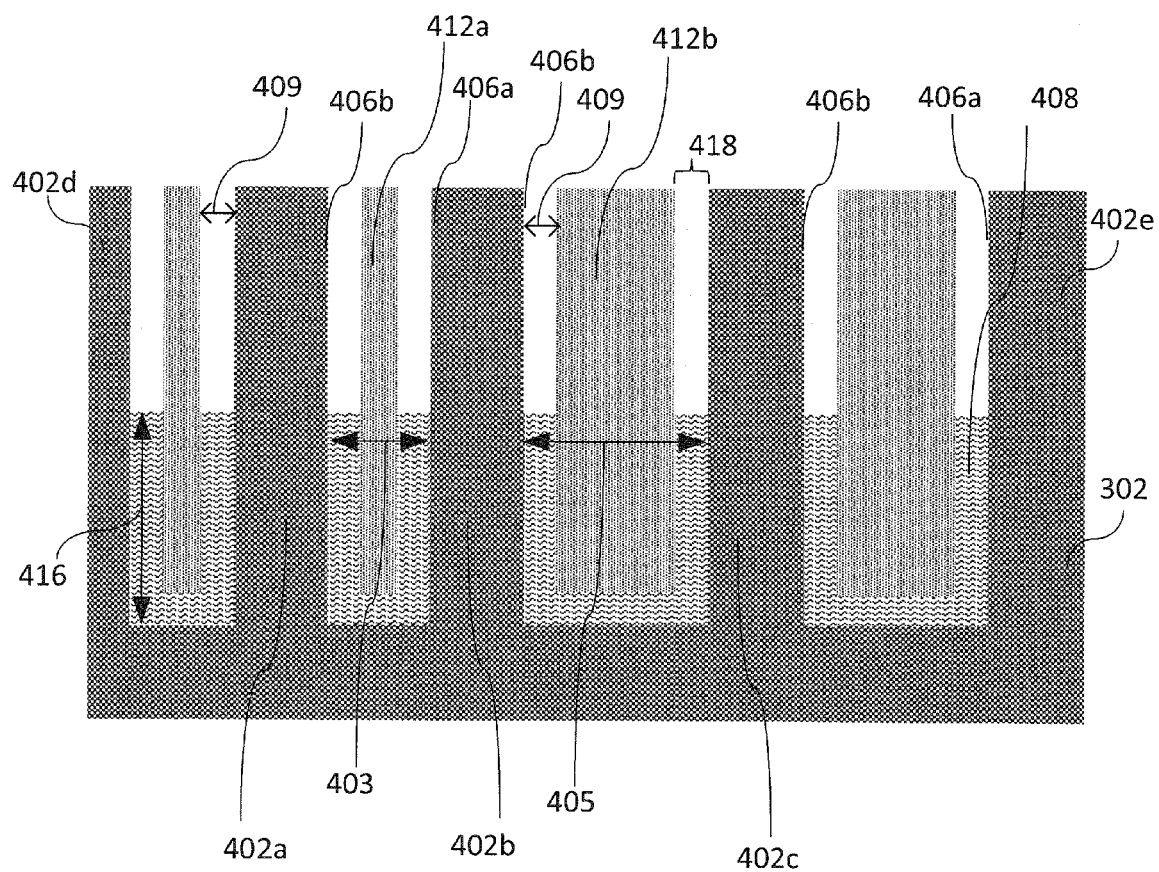

According to various embodiments, after 220 of method 200 has been carried out as described referring to FIG. 4A, 230, 240, and 250 may be carried out in analogy to method 100 resulting in the structure as shown in FIG. 4B.

As it is illustrated in FIG. 4B, the open areas for etching the first layer 408 may be defined by the thickness 409 of the first layer 408. According to various embodiments, at least one additional layer 412 may be formed over the first layer 408 filling the remaining space between the structure elements 402a-402e (e.g. the remaining space 410a between the two adjacent structure elements 402a and 402b, and the remaining space 410b between the two adjacent structure elements 402b and 402c, as shown in FIG. 4A). According to various embodiments, the remaining part 412a of the additional layer 412 (obtained after removing, in 240, a portion of the additional layer 412) may fill the remaining spaces 410a and 410b.

Finally, according to various embodiments, independently from the distance between two adjacent structure elements, material of the first layer 408 may remain between the structure elements 402a-402e and the remaining part 412a of the at least one additional layer 412. As a result, the open areas of the first layer 408 may be independent from the distance between adjacent structure elements, and therefore, according to various embodiments, an etch process (e.g. reactive plasma etching) for removing part of the first layer 408 to partially expose the sidewalls 406a, 406b of the plurality of structure elements 402a-402e may be independent from an aspect ratio (e.g. etching rates may be independent from the distance between two adjacent structure elements). According to various embodiments, the open area of the first layer 408 may be proportional to the open width (e.g. the open area 418 of the first layer 408 may be proportional to the open width (equal layer thickness 409 of the first layer 408) between structure element 402c and remaining part 412a of additional layer 412). According to various embodiments, the remaining material of the first layer 408, after having performed method 200 as described above, may have the same (or substantially the same) height 416 everywhere independently from the distance between adjacent structure elements, as shown in FIG. 4B.

According to various embodiments, method 100, as shown in FIG. 1 and described referring to FIGS. 3A to 3H, may include forming a plurality of structure elements, wherein a structure element may include a surface layer, wherein the surface layer may include or consist of a different material than the body of the structure element. According to various embodiments, a structure element may have the shape of a fin, wherein the fin may include silicon and the surface layer of the fin may include electrically insulating material (e.g. an oxide, e.g. a nitride, e.g. silicon oxide, e.g. silicon nitride, e.g. silicon oxynitride, and the like) or the surface layer may include a layer stack of more than one electrically insulating layer (e.g. an oxide-nitride-oxide layer stack including silicon oxide and silicon nitride). According to various embodiments, at least one structure element of the plurality of structure elements (e.g. all structure elements of the plurality of structure elements) may be formed by patterning a silicon wafer generating a silicon structure, wherein the electrically insulating surface layer may be formed by high temperature oxidation of the silicon structure. According to various embodiments, the electrically insulating surface layer or the electrically insulating surface layer stack may be formed using a deposition process, e.g. a conformal deposition process, e.g. a conformal CVD process as described above). The following figures may illustrate various modifications, extensions, and details referring to the described method 100 and method 200, wherein the plurality of structure elements, or at least one structure element of the plurality of structure elements, may include an insulating surface layer.

Figure 5A:
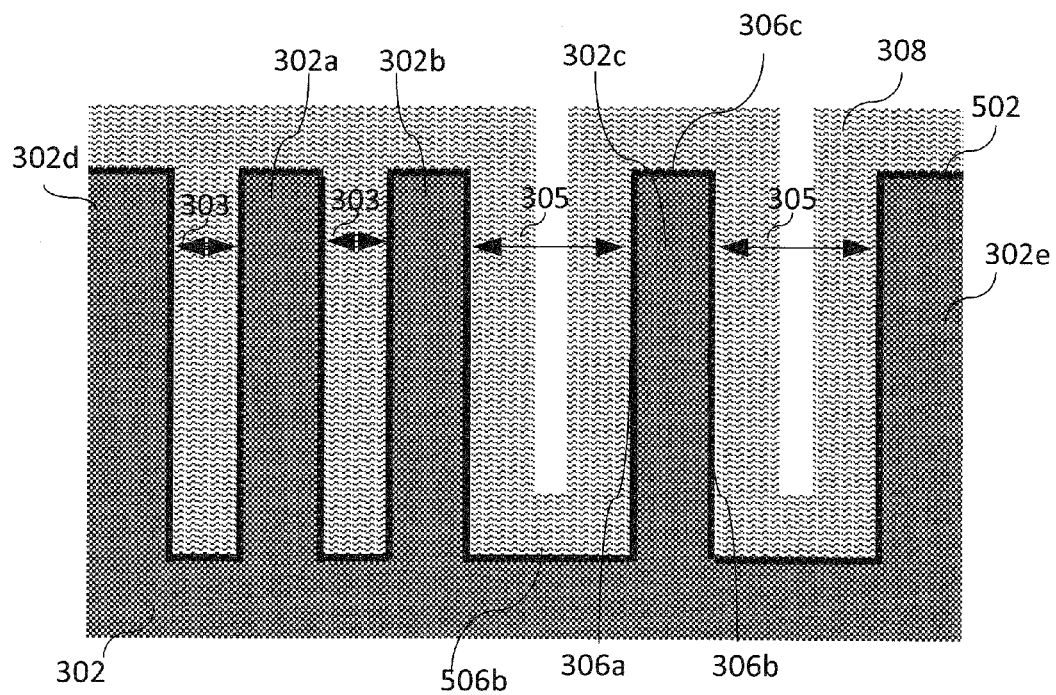
FIGS. 5A and 5B show respectively a cross section of a carrier at various processing stages referring to method 100, according to various embodiments.
Figure 5B:
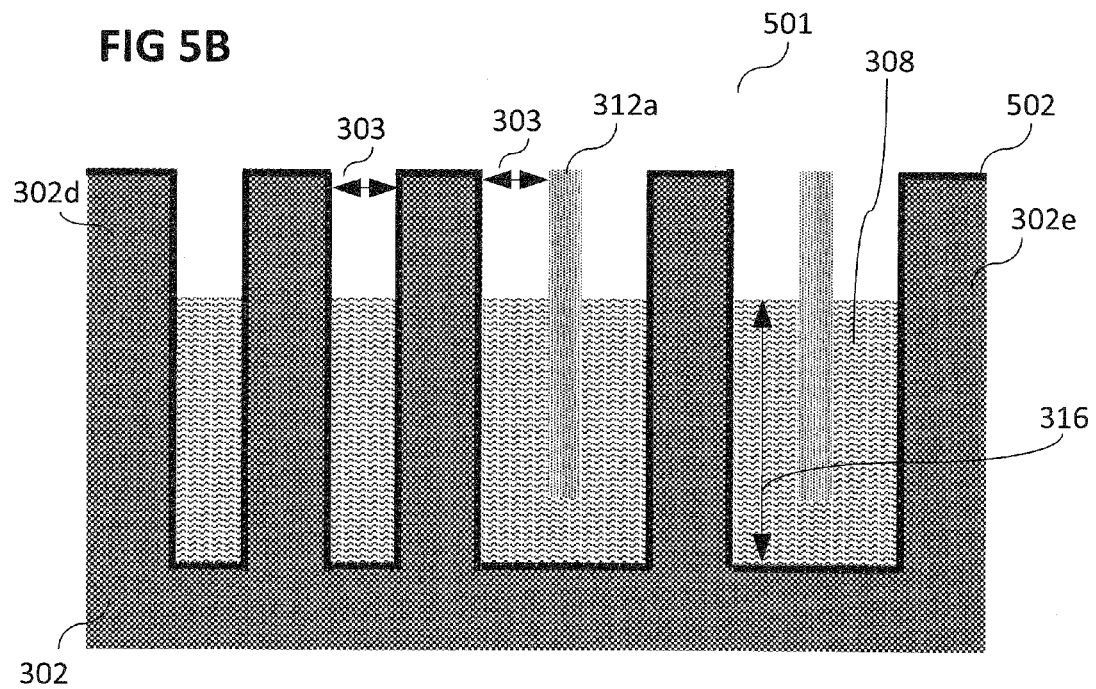

As shown in FIG. 5A, according to various embodiments, the plurality of structure elements 302a-302e may include an electrically insulating surface layer 502, wherein the surface layer 502 may be formed at the upper surface 306c of the structure elements 302a-302e (e.g. the upper surface 306c of structure element 302c), at the sidewalls 306a, 306b of the structure elements 302a-302e (e.g. the sidewalls 306a, 306b of structure element 302c), and bottom regions between the structure elements 302a-302e (e.g. at bottom region 506b between the structure elements 302b and 302c). According to various embodiments, FIG. 5A may illustrate the cross section of a plurality of structure elements 302a-302e (e.g. a plurality of fins) including an insulating surface layer 502, wherein two adjacent structure elements (e.g. two adjacent fins) may have a first distance between each other (e.g. first distance 303 between the structure elements 302a and 302b) and two adjacent structure elements (e.g. two other adjacent fins) may have a distance between each other (e.g. distance 305 between structure elements 302b and 302c), which is larger than two times the first distance (e.g. first distance 303). According to various embodiments, subsequently 130, 140, and 150 of method 100 may be carried out, as already described above, which may result in a structure 501 as shown in FIG. 5B in analogy to FIGS. 3D to 3H and the accompanying description.

According to various embodiments, method 200, as shown in FIG. 2 and described referring to FIGS. 4A and 4B and referring to method 100, as described above, may include forming a plurality of structure elements, wherein the structure elements may include a surface layer, wherein the surface layer may include a different material than the body of the structure element. According to various embodiments, a structure element may have the shape of a fin, wherein, according to some embodiments, the fin may include silicon and the surface layer of the fin may include an electrically insulating material (e.g. an oxide, e.g. a nitride, e.g. silicon oxide, e.g. silicon nitride, e.g. silicon oxynitride, and the like) or the surface layer may include a layer stack of more than one electrically insulating layers (e.g. an oxide-nitride-oxide layer stack including silicon oxide and silicon nitride). According to various embodiments, at least one structure element of the plurality of structure elements (e.g. all structure elements of the plurality of structure elements) may be formed by patterning a silicon wafer generating a silicon structure, wherein the electrically insulating surface layer may be formed by high temperature oxidation of the silicon structure. According to various embodiments, forming the plurality of structure elements may include at least one layering process (e.g. depositing at least one layer using LPCVD or atomic layer deposition).

Figure 6A:
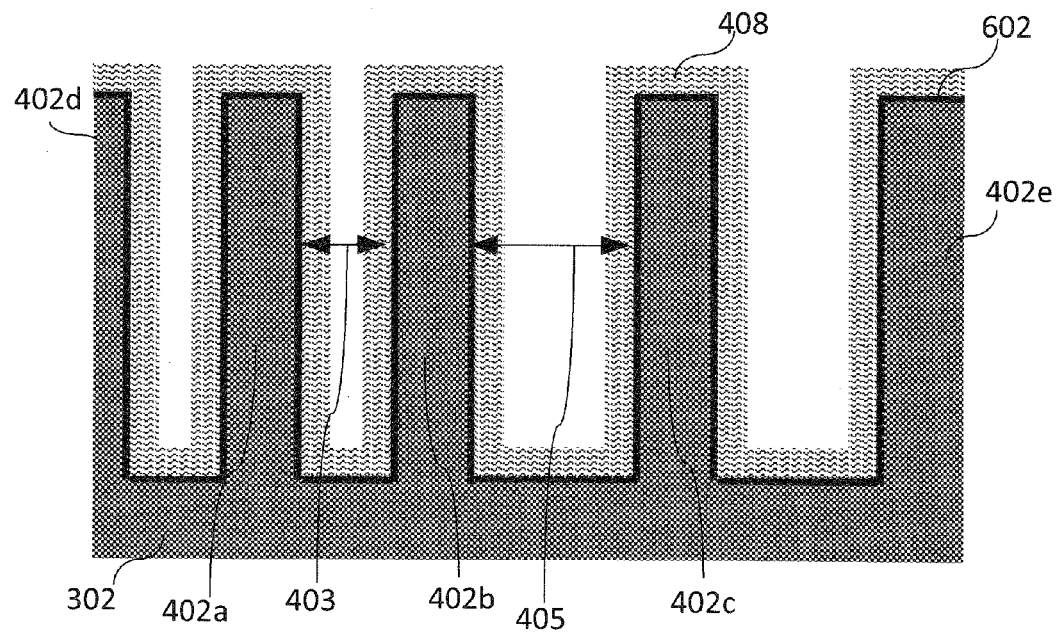
FIGS. 6A and 6B show respectively a cross section of a carrier at various processing stages referring to method 200, according to various embodiments.

As shown in FIG. 6A, according to various embodiments, an electrically insulating layer 602 may form the surface layer of a plurality of structure elements, e.g. forming the surface of the structure elements in analogy to FIG. 5A. FIG. 6A illustrates a cross section of a plurality of structure elements 402a-402e (e.g. a plurality of fins) including an insulating surface layer 602 according to various embodiments (five structure elements 402a, 402b, 402c, 402d, and 402e are shown as an example, however the number of structure elements may be smaller than five or larger than five, and may be any number greater than one in general), wherein at least two adjacent structure elements (e.g. at least two adjacent fins) may have a first distance between each other (e.g. first distance 403 between the two adjacent structure elements 402a and 402b and between the two adjacent structure elements 402d and 402a in the embodiment shown) and at least two adjacent structure elements (e.g. at least two adjacent fins) may have a distance between each other (e.g. distance 405 between the two adjacent structure elements 402b and 402c and between the two adjacent structure elements 402c and 402e in the embodiment shown), which is larger than the first distance (e.g. first distance 403). According to various embodiments, subsequently 230, 240, and 250 of method 200 may be carried out, as already described above, which may result in a structure 601 as shown in FIG. 6B in analogy to FIGS. 4A and 4B and FIGS. 5A and 5B and the corresponding description.

According to various embodiments, an insulating surface layer (or an insulating surface layer stack) of the structure elements (e.g. surface layer 502 or surface layer 602) may have a thickness in the range of about 1 nm to about 100 nm, e.g. about 2 nm to about 80 nm, e.g. about 5 nm to about 40 nm, e.g. in the range of about 5 nm.

Figure 6B:
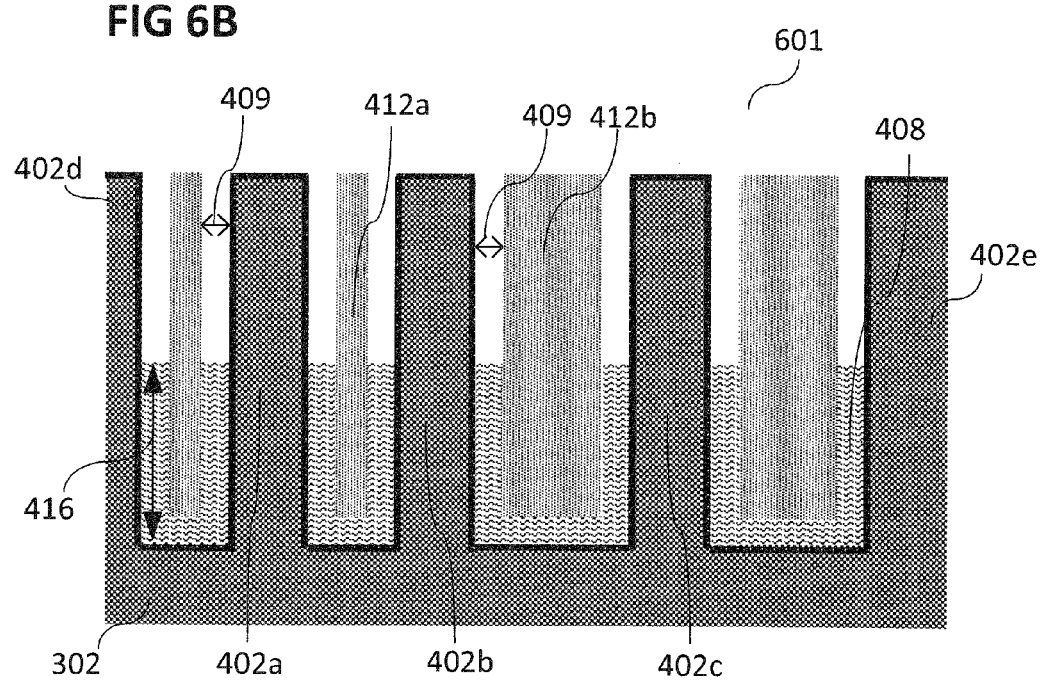

According to various embodiments, the structure 501 and the structure 601 shown in FIGS. 5B and 6B may illustrate cross sections of a FinFET arrangement respectively (cf. FIG. 9).

According to various embodiments, a plurality of structure elements may include a silicon fin surrounded by a gate oxide (e.g. insulating layer 502 or insulating layer 602), wherein the first electrically conductive layer (e.g. the remaining portions 308*a*, 308*b*, and 308*c* of first layer 308 covering the sidewalls 306*a*, 306*b* of the structure elements 302*a*-302*e* as shown in FIG. 3G) may form the control gate of a FinFET. According to various embodiments, the height of the control gate (e.g. the height 316 of the remaining material of the first layer 308 at the sidewalls 306*a*, 306*b* of the structure elements 302*a*-302*e* shown in FIG. 3H, or the height 416 of the remaining material of the first layer 408 at the sidewalls 406*a*, 406*b* of the structure elements 402*a*-402*e* shown in FIG. 4B) may be the same for all gates at the sidewalls of the plurality of structure elements, independently from the distance between two adjacent structure elements. According to various embodiments, the electrical properties of the FinFETs which may be at least partially formed using method 100 or method 200, as described herein, may be the same for all FinFETs of the plurality of FinFETs, independently from the distance between two adjacent fins (e.g. due to that all FinFETs may have the same gate height). According to various embodiments, the first layer (e.g. first layer 308 or first layer 408) may be partially removed to expose the sidewalls of the plurality of fins partially, wherein removing a portion of the first layer in regions between the adjacent fins may be carried out using an etch process, as for example reactive ion etching or plasma etching. According to various embodiments, since the open areas of the first layer at the sidewalls of the structure elements may be, due to applying method 100 or method 200 as described herein, independent from the distance between the adjacent structure elements, an etch process, as for example reactive ion etching or plasma etching, may be used without or with reduced effects of the loading mechanisms typically occurring during the plasma etching or reactive ion etching.

According to various embodiments, more than one additional layer may be formed over the first layer, in 230 (or in 130 as well), wherein the plurality of additional layers may cover the exposed surface of the first layer. According to various embodiments, forming more than one additional layer may include forming a second layer over the first layer, and subsequently forming a third layer over the second layer, wherein at least one of the second layer and the third layer may fill a remaining space between the at least two adjacent structure elements.

Figure 7A:
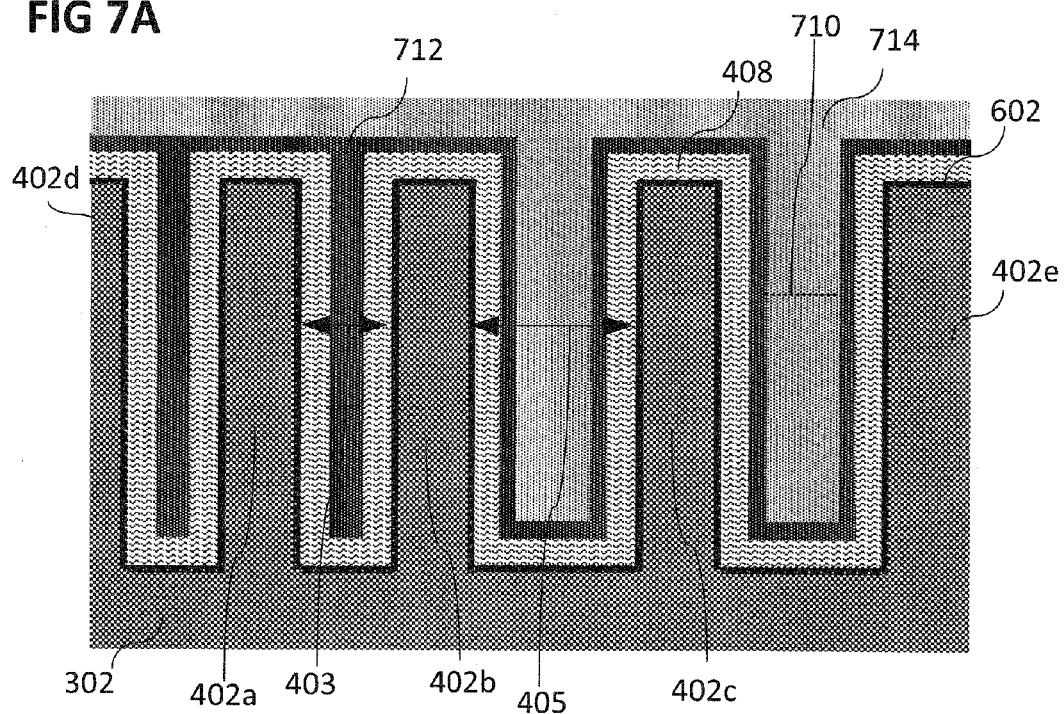
FIGS. 7A and 7B show respectively a cross section of a carrier at various processing stages referring to method 200, according to various embodiments.

As shown in FIG. 7A, a first remaining space, e.g. remaining space 410*a* between structure elements 402*a* and 402*b*, as shown in FIG. 4A, may be filled by a second layer 712, covering the first layer 408, wherein the second remaining space, e.g. remaining space 410*b* between structure elements 402*b* and 402*c*, as shown in FIG. 4A, may be not filled completely by the second layer 712, according to various embodiments. Further, after forming the second layer 712, a remaining space which may be not filled completely by second layer 712 (e.g. remaining space 710 as shown in FIG. 7A) may be filled by a third layer 714 covering the second layer 712. According to various embodiments, the first layer 408 may be formed to have a small thickness (e.g. a thickness in the range from about 10 nm to about 100 nm, e.g. a thickness in the range from about 20 nm to about 50 nm) e.g. by using a conformal deposition process. According to various embodiments, the second layer 712 may be formed to have a larger thickness, (e.g. a thickness in the range from 100 nm to 1 µm, e.g. in the range from about 40 nm to about 200 nm, e.g. from about 80 nm to about 160 nm, e.g. a layer thickness of about 100 nm according to one embodiment (or larger than 100 nm, according to another embodiment), e.g. by using a CVD process (as described above). According to various embodiments, the second layer may 712 be grown by thermal oxidation of the first layer 408, e.g. by forming a high temperature oxide, e.g. by forming a high-temperature silicon oxide if the first layer 408 includes silicon (e.g. polycrystalline silicon). According to various embodiments, the second layer 712 and the third layer 714 may include an electrically insulating material. According to various embodiments, the second layer 712 and the third layer 714 may include an oxide layer, e.g. a silicon oxide layer, or a nitride layer, e.g. silicon nitride layer.

According to various embodiments, the material or materials forming the additional layer (e.g. additional layer 312, e.g. additional layer 412), or the plurality of additional layers, e.g. the second layer (e.g. second layer 712) and the third layer (e.g. third layer 714), may be selected from a group of suitable materials in such a way, that the first layer (e.g. first layer 308 or 408) may be selectively etched in 150 and 250, wherein the first layer may be partially removed exposing the sidewalls of at least two adjacent structure elements partially. For example, according to various embodiments, the first layer may include silicon, and the at least one additional layer may include silicon oxide. According to various embodiments, the surface layer of the plurality of structure elements (e.g. surface layer 502, e.g. surface layer 602), or the plurality of structure elements (e.g. structure elements 302*a*, 302*b*, and 302*c*, e.g. structure elements 402*a*, 402*b*, and 402*c*) may include silicon oxide, such that the first layer (e.g. first layer 308 or 408) may be etched selectively with respect to the structure elements and the at least one additional layer (e.g. additional layer 312, e.g. additional layer 412, e.g. second layer 712 and third layer 714).

Figure 7B:
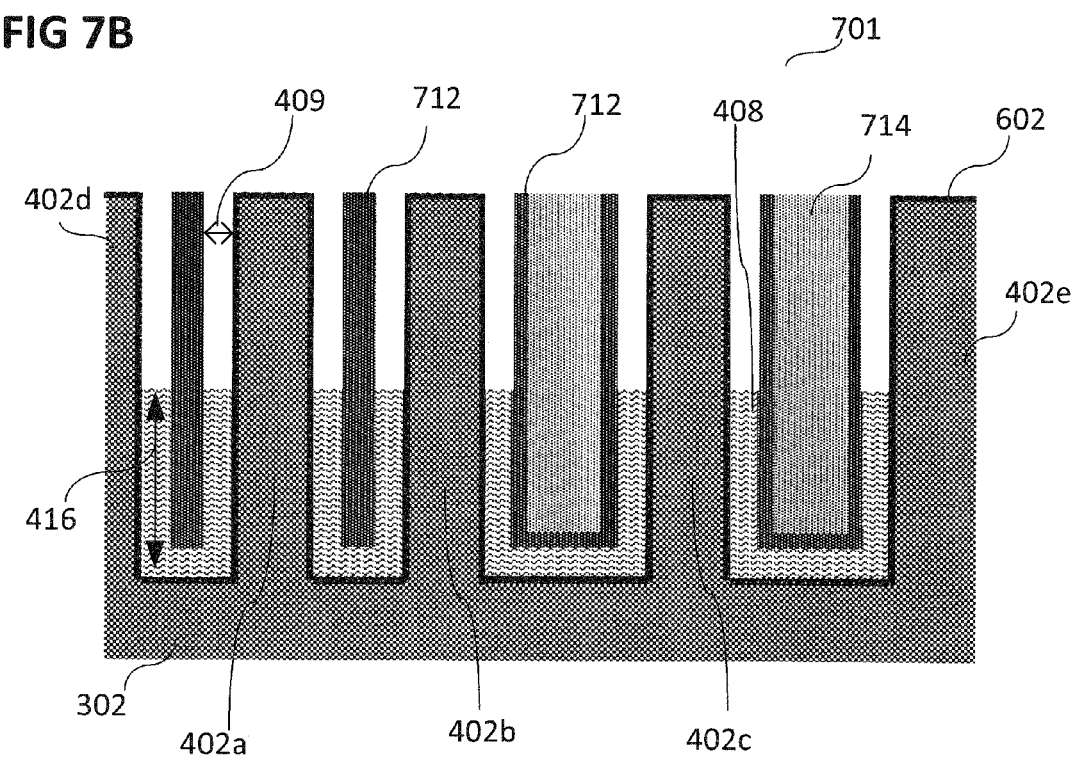

According to various embodiments, the selective etch process of the first layer 408, as described referring to FIG. 7A, may result in structure 701 as shown in FIG. 7B, in analogy to the processes referring to method 100 and method 200 described before.

According to various embodiments, since an opening, e.g. a hole, a recess or a trench, may also be commonly referred to as a structure element (e.g. an array of holes may generate a complex structure of remaining material between two adjacent holes respectively), it has to be noted, that in the description referring to method 100 and method 200, an opening, e.g. a hole, a recess or a trench, itself may not be regarded as a structure element, but that at least one opening, e.g. at least one hole, at least one recess or at least one trench, may generate at least one structure element, wherein the at least one structure element may be formed by remaining material between adjacent openings, e.g. adjacent holes, adjacent recesses or adjacent trenches. In this case, a distance between two adjacent structure elements may be defined by a lateral extension of an opening (e.g. hole, recess, or trench), and a width of a generated structure element may be defined by a distance between respective sidewalls of adjacent openings (e.g. holes, recesses, or trenches). According to various embodiments, forming a plurality of structure elements at least one of over and in a carrier, as included in 110 shown in FIG. 1, may include generating at least one structure element by forming an opening (e.g. at least one of a hole, trench, and recess).

Figure 8:
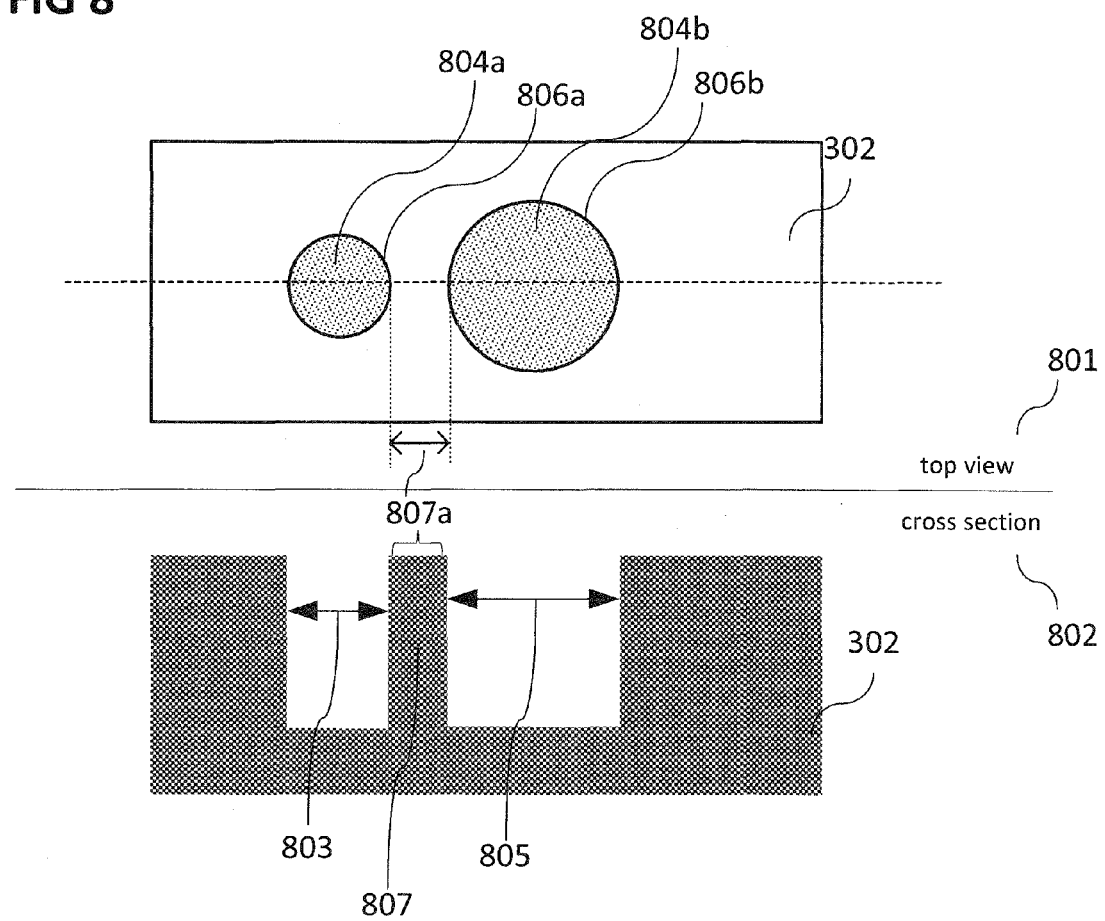
FIG. 8 shows a top view and a cross section of a carrier including a plurality of holes, according to various embodiments.

According to various embodiments, a plurality of structure elements formed at least one of over and in a carrier, as described referring to method 100 and method 200, may include forming a plurality of holes, as shown exemplarily in FIG. 8. According to various embodiments, FIG. 8 shows a top view 801 and a cross section 802 of a carrier 302 including a plurality of holes 804a, 804b (two holes 804a and 804b are shown as an example, however the number of holes may be greater than two, and may be any integer number greater than or equal to two in general) (e.g. at a first processing stage, as for example after 110 or 210 in methods 100 and 200, respectively, has been carried out), wherein at least one hole (e.g. hole 804a) may have a first diameter 803, and at least one hole (e.g. hole 804b) may have a diameter 805 being larger than the first diameter 803.

As shown in FIG. 8, according to various embodiments, the distance between two adjacent structure elements, as described above referring to method 100 and method 200, may be in this case defined by the lateral extension of the hole (e.g. the diameter of the respective hole as shown in FIG. 8), and the width of a generated structure element (e.g. generated structure element 807) may be defined by a distance, e.g. smallest distance, (e.g. distance 807a) between respective sidewalls of two adjacent holes (e.g. by the distance 807a between the sidewall 806a of the first hole 804a and the sidewall 806b of the second hole 804b). According to various embodiments, forming a plurality of structure elements at least one of over and in a carrier, as included in method 100 shown in FIG. 1 and method 200 shown in FIG. 2, may include generating at least one structure element by forming at least one hole.

As can be seen by the example shown in FIG. 8, method 100 and method 200 may also be applied on a carrier 302 including a plurality of holes, wherein at least one hole 804a may have a first diameter 803 and at least one hole 804b may have a diameter 805 which is larger than the first diameter (e.g. referring to method 200), or wherein at least one hole 804a may have a first diameter 803 and at least one hole 804b may have a diameter 805 which is larger than two times the first diameter 803 (e.g. referring to method 100). In analogy, the height of the remaining material of a first layer at the sidewalls (e.g. sidewalls 806a and 806b as shown in FIG. 8) of the plurality of holes may have the same height for all holes independently from the respective diameter of the hole (e.g. diameter 803 and 805), if the method 100 or method 200 is carried out as described above. Referring to this, according to various embodiments, loading effects (e.g. aspect ratio dependent etching) during the formation of a structure partially covering the respective sidewalls of a plurality of holes (e.g. the partially removed first layer) may be reduced or may be avoided by using method 100 or method 200, as described above.

According to various embodiments, the diameter of a hole (e.g. 804a or 804b) may be in the range from about 5 nm to about 200 nm, e.g. about 20 nm to about 150 nm, e.g. about 60 nm to about 120 nm, or may be about 90 nm according to one embodiment (or larger than 200 nm, according to another embodiment).

According to various embodiments, a plurality of structure elements formed at least one of over and in a carrier, as described referring to method 100 and method 200, may include forming a plurality of recesses (or trenches), as shown exemplarily in FIG. 9. According to various embodiments, FIG. 9 shows a top view 901 and a cross sectional view 902 of a carrier 302 (e.g. at a first processing stage, as for example after 110 or 210 have been carried out) including a plurality of recesses (or trenches), as for example recess 904a and recess 904b, wherein at least one recess (e.g. recess 904a) may have a first extension 903, and at least one recess (e.g. recess 904b) may have an extension 905 being larger than the first extension 903. According to various embodiments, the first extension 903 of the recess 904a may define a first distance between two adjacent structure elements (e.g. the first distance 903 between structure element 302a and structure element 302b) and the extension 905 of recess 904b (being larger than the first extension 903) may define a distance between two adjacent structure elements (e.g. distance 905 between structure element 302b and structure element 302c) which is larger than the first distance (e.g. the first distance 903 between structure element 302a and structure element 302b).

As shown in FIG. 9, according to various embodiments, the distance between two adjacent structure elements, as described above referring to method 100 and method 200, may be in this case defined by the lateral extension of the recess, and the width of the corresponding structure element (e.g. generated structure element 302b) may be defined by a distance (e.g. distance 907a) between respective sidewalls of two adjacent recesses (e.g. by the distance 907a between the sidewall 906a of the recess 904b and the sidewall 906b of the recess 904c). According to various embodiments, forming a plurality of structure elements at least one of over and in a carrier, as included in method 100 shown in FIG. 1 and method 200 shown in FIG. 2, may include generating at least one structure element by forming at least one recess (or trench).

As can be seen by the example shown in FIG. 9, method 100 and method 200 may also be applied to a carrier 302 including a plurality of recesses (or trenches), wherein at least one recess (or trench) may have a first extension and at least one recess (or trench) may have an extension which is larger than the first extension (e.g. referring to method 200), or wherein at least one recess (or trench) may have a first extension and at least one recess (or trench) may have an extension which is larger than two times the first extension (e.g. referring to method 100). In analogy, the height of the remaining material of a first layer at the sidewalls (e.g. at the sidewalls 906a and 906b) of the plurality of recesses (or trenches) may have the same height for all recesses (or trenches) independently from the respective extension of the recess (or trench) (e.g. extension 903 and 905), if the method 100 or method 200 is carried out as described above. Referring to this, according to various embodiments, loading effects (e.g. aspect ratio dependent etching) during the formation of a structure partially covering the respective sidewall of a plurality of recesses (or trenches) (e.g. the partially removed first layer 308 or 408 after 150 or 250 in method 100 or 200, respectively) may be reduced or may be avoided by using method 100 or method 200, as described above.

Further, according to various embodiments, the first distance (e.g. distance 303, 403, 803, 903) may be in the range from about 10 nm to about 300 nm, e.g. about 20 nm to about 200 nm, e.g. about 70 nm to about 110 nm, e.g. about 80 nm to about 100 nm, e.g. about 90 nm, or e.g. smaller than 90 nm or e.g. larger than 90 nm. According to various embodiments, at least two adjacent structure elements may have a distance between each other (e.g. distance 305, 405, 805, 905) being larger than the corresponding first distance (e.g. distance 303, 403, 803, 903), e.g. distance 305, 405, 805, 905 may be in the range from about 10 nm to about 600 nm, e.g. about 50 nm to about 500 nm, e.g. about 90 nm to about 300 nm, e.g. about 170 nm to about 300 nm, e.g. smaller than 180 nm, or e.g. larger than 180 nm.

According to various embodiments, at least two adjacent structure elements may have a distance between each other which is a multiplicity of the first distance between two adjacent structure elements (e.g. three times, five times, or seven times the first distance according to some embodiments, or another multiple of the first distance according to other embodiments). According to various embodiments, at least two adjacent structure elements may have a distance between each other which is three times the first distance between two adjacent structure elements (e.g. the first distance may be about 90 nm and two adjacent structure elements may have a distance of about 270 nm between each other).

According to various embodiments, the width (or the lateral extension) of a structure element may be in the range from about 10 nm to 200 nm, e.g. about 20 nm to about 170 nm, e.g. about 70 nm to about 110 nm, e.g. about 80 nm to about 100 nm, e.g. about 90 nm.

According to various embodiments, at least one structure element of the plurality of structure elements may have a different height than the other structure elements. Further, according to various embodiments, at least one opening, e.g. at least one recess, at least one trench or at least one hole (as shown in FIGS. 8 and 9), may have a different depth than the other openings, e.g. recesses, trenches or holes. As a result, according to various embodiments, the sidewalls of the structure elements may not have necessarily the same size (or the same area).

According to various embodiments, at least one structure element of the plurality of structure elements may be a dummy structure element, which may have no electrical functionality in an integrated circuit. According to various embodiments, at least one structure element of the plurality of structure elements may be differently designed with respect to the other structure elements.

According to another embodiment, the first layer (e.g. first layer 308 or first layer 408) may not cover the bottom surfaces of regions between at least one pair of adjacent structure elements (e.g. the bottom surface of region 311 between the structure elements 302c and 302e, as shown in FIG. 3C, or bottom surface of region 411 between the structure elements 402c and 402e, as shown in FIG. 4A). According to another embodiment, the first layer (e.g. first layer 308 or first layer 408) may be partially removed from the bottom surfaces regions between the structure elements (e.g. from the bottom surface of region 311 between the structure elements 302c and 302e, as shown in FIG. 3C, or from the bottom surface of region 411 between the structure elements 402c and 402e, as shown in FIG. 4A), after the first layer (e.g. first layer 308 or first layer 408) is deposited over the structure elements (e.g. by using a patterning process). According to another embodiment, the first layer (e.g. first layer 308 or first layer 408) may cover at least partially the sidewalls of the structure elements (e.g. the sidewalls 306a, 306b of structure elements 302a-302e or the sidewalls 406a, 406b of structure elements 402a-402e), wherein the regions (or at least two regions) formed by the material of the first layer 308 at the sidewalls of the respective structure elements are not electrically connected with each other via material of the first layer 308.

According to various embodiments, the term "surface layer" as used herein above with regards to a "surface layer or a surface layer stack" of a structure element, or a "surface layer" of a plurality of structure elements may refer to at least the upper surface and the sidewalls of each structure element of the plurality of structure elements.

According to various embodiments, two control gates provided by the electrically conductive first layer at the adjacent sidewalls of two adjacent structure elements (e.g. two adjacent control gates of two adjacent FinFETS) may be electrically connected with each other due to the remaining material of the first layer between the two adjacent structure elements (e.g. the bottom region 506b between the structure elements 302b and 302c, as for example shown in FIGS. 5A and 5B, may electrically connect the respective control gates provided by the first layer 308).

According to another embodiment (not shown in figures), the control gates provided by the electrically conductive first layer at the respective sidewalls of the structure elements (e.g. of the FinFETS) may not be electrically connected with each other by a remaining material of the first layer between two adjacent structure elements (e.g. by the remaining material in the bottom region 506b between the structure elements 302b and 302c, as for example shown in FIGS. 5A and 5B). Therefore, according to various embodiments, remaining material in the bottom region between two adjacent structure elements, which electrically connects two adjacent control gates at the respective sidewalls of two adjacent structure elements (e.g. remaining material of the first layer 308 in the bottom region 506b between the structure elements 302b and 302c, as for example shown in FIGS. 5A and 5B), may be removed, e.g. before the at least one additional layer may be formed over the first layer (e.g. layer 312 formed over layer 308).

According to various embodiments, a part of the first layer may be removed before the at least one additional layer may be formed over the first layer, such that the gates of the FinFETS may be separated from each other.

According to various embodiments, a method for processing a carrier may include: forming a plurality of structure elements at least one of over and in a carrier, wherein at least two adjacent structure elements of the plurality of structure elements may have a first distance between each other; depositing a first layer over the plurality of structure elements, the first layer having a thickness which equals the first distance between the at least two adjacent structure elements; forming at least one additional layer over the first layer, wherein the at least one additional layer may cover an exposed surface of the first layer; removing a portion of the at least one additional layer to expose the first layer partially; partially removing the first layer, wherein at least one sidewall of the at least two adjacent structure elements may be partially exposed.

According to various embodiments, a method for processing a carrier may include: forming a plurality of structure elements at least one of over and in a carrier, wherein at least two adjacent structure elements of the plurality of structure elements may have a first distance between each other; depositing a first layer over the plurality of structure elements, the first layer having a thickness which is smaller than half of the first distance between the at least two adjacent structure elements; forming at least one additional layer over the first layer, wherein the at least one additional layer may cover an exposed surface of the first layer; removing a portion of the at least one additional layer to expose the first layer partially; and partially removing the first layer, wherein at least one sidewall of the at least two adjacent structure elements is partially exposed.

According to various embodiments, the plurality of structure elements may be formed over a main processing surface of the carrier.

According to various embodiments, the plurality of structure elements may include at least one electrically insulating layer at a surface of at least one structure element of the plurality of structure elements.

According to various embodiments, the at least one electrically insulating layer may include an oxide layer.

According to various embodiments, at least one structure element of the plurality of structure elements may have the shape of a fin.

According to various embodiments, at least one structure element of the plurality of structure elements may be part of a FinFET.

According to various embodiments, depositing the first layer over the plurality of structure elements may include conformally depositing the first layer over the plurality of structure elements.

According to various embodiments, the first layer may include at least one electrically conductive material.

According to various embodiments, the first layer may include electrically conductive polycrystalline silicon.

According to various embodiments, forming the at least one additional layer over the first layer may include depositing at least one layer using a conformal deposition process.

According to various embodiments, forming the at least one additional layer over the first layer may include growing at least one layer using thermal oxidation.

According to various embodiments, the at least one additional layer may include a material that is different from a material of the first layer.

According to various embodiments, forming the at least one additional layer over the first layer may include: forming at least a second layer over the first layer, wherein the second layer may fill a remaining space between adjacent structure elements of the plurality of structure elements.

According to various embodiments, at least two adjacent structure elements of the plurality of structure elements may have a distance between each other which is larger than two times the first distance.

According to various embodiments, at least two adjacent structure elements of the plurality of structure elements may have a distance between each other which is larger than two times the first distance, wherein the first layer may have a thickness which equals the first distance.

According to various embodiments, at least two adjacent structure elements (e.g. at least one pair of adjacent structure elements) of the plurality of structure elements may have a first distance between each other and at least two adjacent structure elements (e.g. at least one other pair of adjacent structure elements) of the plurality of structure elements may have a distance between each other which is larger than two times the first distance, wherein the first layer may be formed over the plurality of structure elements, the first layer having a thickness which equals the first distance.

According to various embodiments, forming the at least one additional layer may include: forming a second layer over the first layer and forming a third layer over the second layer, wherein at least one of the second layer and the third layer may fill a remaining space between at least two adjacent structure elements of the plurality of structure elements.

According to various embodiments, at least two adjacent structure elements of the plurality of structure elements may have a first distance between each other and at least two adjacent structure elements of the plurality of structure elements may have a distance between each other which is larger than the first distance.

According to various embodiments, at least two adjacent structure elements of the plurality of structure elements may have a distance between each other which is larger than the first distance.

According to various embodiments, at least two adjacent structure elements of the plurality of structure elements may have a distance between each other which is larger than the first distance, wherein the first layer may be formed over the plurality of structure elements, the first layer having a thickness which is smaller than half of the first distance.

According to various embodiments, at least two adjacent structure elements (e.g. at least one pair of adjacent structure elements) of the plurality of structure elements may have the first distance between each other and at least two adjacent structure elements (e.g. at least one other pair of adjacent structure elements) of the plurality of structure elements may have a distance between each other which is larger than the first distance, wherein the first layer may be formed over the plurality of structure elements, the first layer having a thickness which is smaller than half of the first distance.

According to various embodiments, removing the portion of the at least one additional layer to expose the first layer partially may include partially removing the at least one additional layer and removing a portion of the first layer, such that a common surface is exposed, wherein the common surface may be formed at least by the upper surfaces of the plurality of structure elements (e.g. additionally by the surface of the carrier as well, as described referring to FIG. 3B). According to various embodiments, exposing the common surface by partially removing the at least one additional layer and removing the portion of the first layer may include a CMP process, which may be selective or non-selective to the specific material of the first layer and the at least one additional layer.

According to various embodiments, a method for processing a carrier may include: forming a plurality of structure elements at least one of over and in a carrier, wherein at least two adjacent structure elements may have a first distance between each other and at least two adjacent structure elements may have a distance between each other being larger than the first distance, depositing a first layer over the carrier, the first layer having a thickness smaller than half of the first distance, filling a remaining space between the adjacent structure elements with a fill material after depositing the first layer; and partially removing the first layer, wherein at least one sidewall of at least one structure element of the plurality of structure elements may be partially exposed.

According to various embodiments, a method for processing a carrier may include: forming a plurality of structure elements at least one of over and in a carrier, wherein at least two adjacent structure elements may have a first distance between each other and at least two adjacent structure elements may have a distance between each other being larger than two times the first distance; depositing a first layer over the carrier, the first layer having a thickness which equals the first distance, filling a remaining space between the adjacent structure elements with fill material after depositing the first layer; and partially removing the first layer, wherein at least one sidewall of at least one structure element of the plurality of structure elements may be partially exposed.

According to various embodiments, the plurality of structure elements may include at least one electrically insulating layer at the surface of at least one structure element of the plurality of structure elements.

According to various embodiments, filling the remaining space between the adjacent structure elements may include: forming a second layer over the first layer, depositing a third layer over the second layer, wherein at least one of the second layer and the third layer may fill the remaining space between the adjacent structure elements; and partially removing material of at least the second layer and the third layer to partially expose the first layer.

According to various embodiments, forming the second layer over the first layer may include forming the second layer over the first layer using a conformal deposition process.

According to various embodiments, forming the third layer over the second layer may include forming the third layer over the second layer using a conformal deposition process.

According to various embodiments, at least one of the second layer and the third layer may include a material that is different from a material of the first layer.

According to various embodiments, forming the second layer over the first layer may include forming the second layer using high temperature oxidation.

According to various embodiments, filling the remaining space between adjacent structure elements may include: forming a second layer over the first layer which may fill the remaining space between adjacent structure elements; and partially removing material of at least the second layer to at least partially expose the first layer.

According to various embodiments, depositing the first layer over the carrier may include conformally depositing the first layer.

According to various embodiments, the first layer may include electrically conductive material.

According to various embodiments, the first layer may include polycrystalline silicon.

According to various embodiments, at least one structure element of the plurality of structure elements may be at least a part of a FinFET.

According to various embodiments, the at least one additional layer may serve as an etch mask for partially removing the first layer, wherein at least one sidewall of the plurality of structure elements is partially exposed. According to various embodiments, the insulating surface layer (which may be a part of at least one structure element of the plurality of structure elements) may serve as an etch mask for partially removing the first layer, wherein at least one sidewall of the plurality of structure elements is partially exposed.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a carrier, the method comprising:
    forming a plurality of structure elements at least one of over and in the carrier, wherein at least two adjacent structure elements of the plurality of structure elements have a first distance between each other, and wherein at least two adjacent structure elements of the plurality of structure elements have a distance between each other which is larger than two times the first distance;
    depositing a first layer over the plurality of structure elements, the first layer having a thickness which equals the first distance between the at least two adjacent structure elements;
    forming at least one additional layer over the first layer, wherein the at least one additional layer covers an exposed surface of the first layer;
    removing a portion of the at least one additional layer to expose the first layer partially, wherein a remaining part of the at least one additional layer, which is disposed between the at least two adjacent structure elements of the plurality of structure elements having the distance between each other which is larger than two times the first distance, is spaced apart from these at least two adjacent structure elements with the first distance; and subsequently,
    partially removing the exposed first layer, wherein at least one sidewall of the plurality of structure elements is partially exposed.

2. The method of claim 1,
the plurality of structure elements comprising at least one electrically insulating layer at a surface of at least one structure element of the plurality of structure elements.

3. The method of claim 2, wherein
the at least one electrically insulating layer comprises an oxide layer.

4. The method of claim 1, wherein
at least one structure element of the plurality of structure elements has the shape of a fin.

5. The method of claim 1, wherein
at least one structure element of the plurality of structure elements is part of a FinFET.

6. The method of claim 1, wherein depositing the first layer over the plurality of structure elements comprises conformally depositing the first layer over the plurality of structure elements.

7. The method of claim 1, wherein
the first layer comprises electrically conductive material.

8. The method of claim 1, wherein
the first layer comprises electrically conductive polycrystalline silicon.

9. The method of claim 1, wherein
forming the at least one additional layer comprises depositing at least one layer using a conformal deposition process.

10. The method of claim 1, wherein
forming the at least one additional layer comprises growing at least one layer using high temperature oxidation.

11. The method of claim 1, wherein
the at least one additional layer comprises a material that is different from a material of the first layer.

12. The method of claim 1, wherein
forming the at least one additional layer comprises:
    forming at least a second layer over the first layer,
    wherein the second layer fills a remaining space between adjacent structure elements of the plurality of structure elements.

* * * * *